United States Patent
Rode et al.

(10) Patent No.: US 11,502,191 B2
(45) Date of Patent: Nov. 15, 2022

(54) TRANSISTORS WITH BACKSIDE FIELD PLATE STRUCTURES

(71) Applicant: Intel Corporation, Santa Clara, CA (US)

(72) Inventors: Johann Christian Rode, Hillsboro, OR (US); Nidhi Nidhi, Hillsboro, OR (US); Rahul Ramaswamy, Portland, OR (US); Han Wui Then, Portland, OR (US); Walid M. Hafez, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 761 days.

(21) Appl. No.: 16/275,631

(22) Filed: Feb. 14, 2019

(65) Prior Publication Data

US 2020/0266291 A1    Aug. 20, 2020

(51) Int. Cl.
*H01L 29/66* (2006.01)
*H01L 29/778* (2006.01)
*H01L 29/40* (2006.01)

(52) U.S. Cl.
CPC .......... *H01L 29/778* (2013.01); *H01L 29/407* (2013.01); *H01L 29/66462* (2013.01)

(58) Field of Classification Search
CPC ................. H01L 29/778; H01L 29/407; H01L 29/66462
USPC ........................................................ 257/139
See application file for complete search history.

(56) References Cited

U.S. PATENT DOCUMENTS 9,053,964 B2 * 6/2015 Jeon ...................... H01L 27/085

\* cited by examiner

*Primary Examiner* — Tan N Tran
(74) *Attorney, Agent, or Firm* — Akona IP

(57) ABSTRACT

Disclosed herein are IC structures that implement field plates for III-N transistors in a form of electrically conductive structures provided in a III-N semiconductor material below the polarization layer (i.e., at the "backside" of an IC structure). In some embodiments, such a field plate may be implemented as a through-silicon via (TSV) extending from the back/bottom face of the substrate towards the III-N semiconductor material. Implementing field plates at the backside may provide a viable approach to changing the distribution of electric field at a transistor drain and increasing the breakdown voltage of an III-N transistor without incurring the large parasitic capacitances associated with the use of metal field plates provided above the polarization material. In addition, backside field plates may serve as a back barrier for advantageously reducing drain-induced barrier lowering.

20 Claims, 11 Drawing Sheets

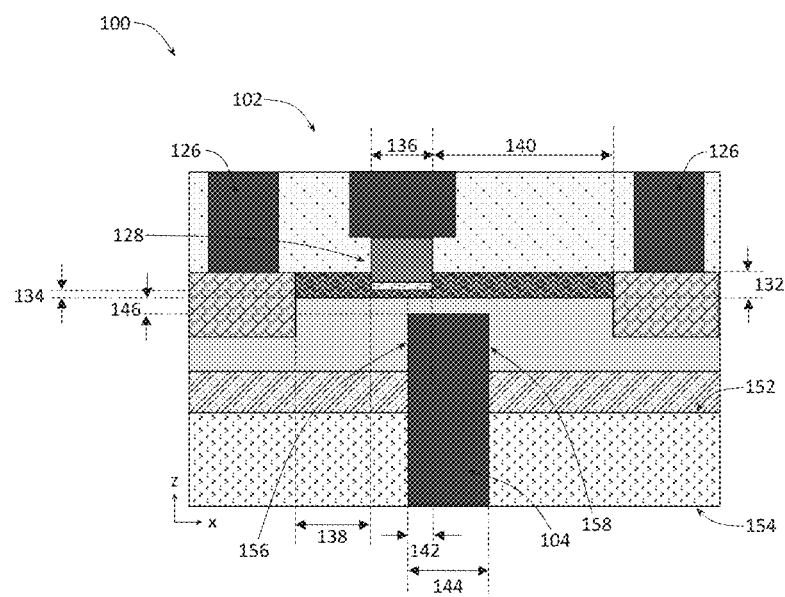
FIG. 1
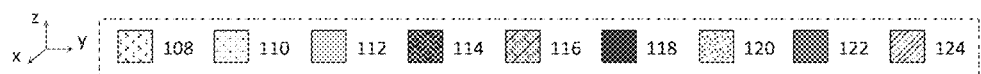

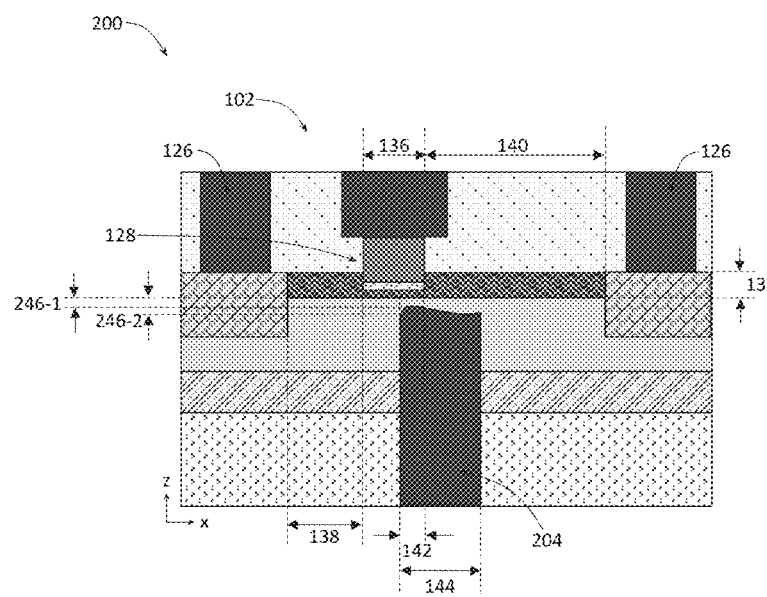
FIG. 2
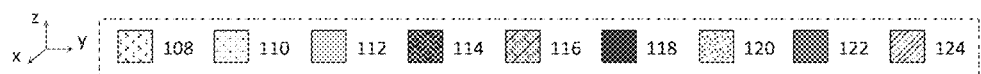

402
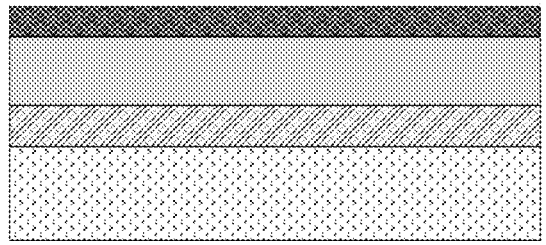
FIG. 4A
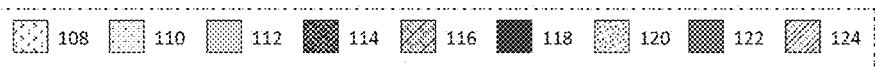

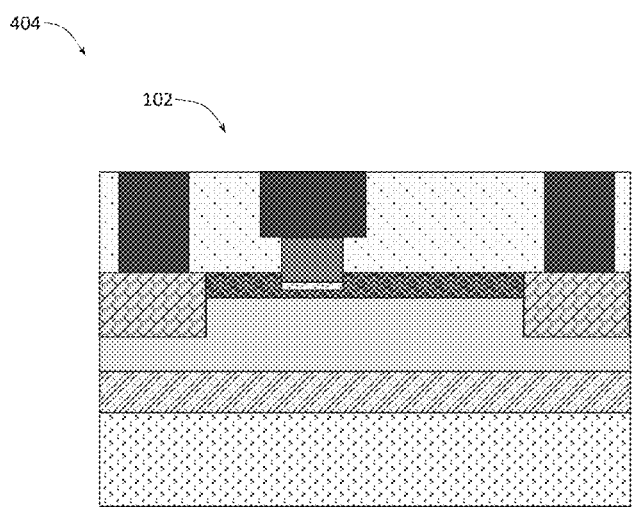
FIG. 4B
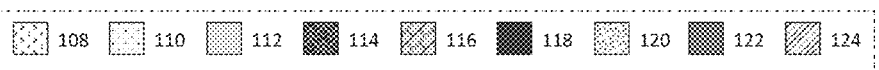

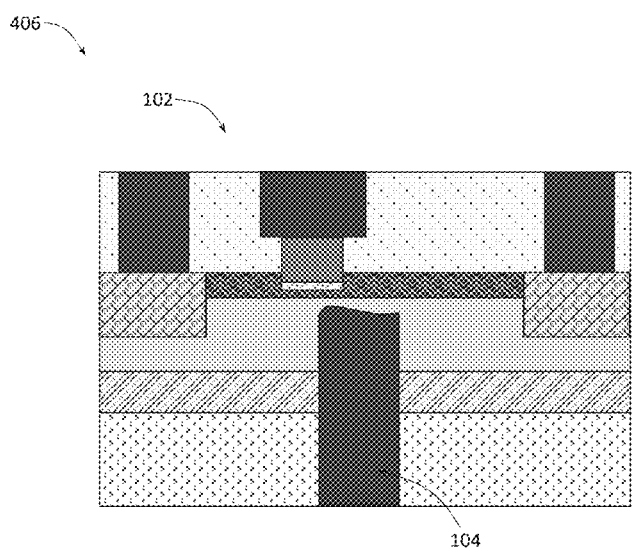
FIG. 4C
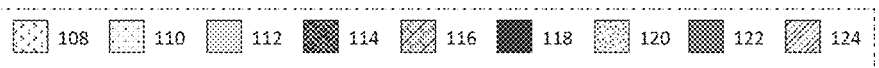

TRANSISTORS WITH BACKSIDE FIELD PLATE STRUCTURES

BACKGROUND

Field-effect transistors (FETs) are devices that include a semiconductor channel material, as well as gate, drain, and source terminals. The conductivity between the drain and source terminals is controlled by an electric field in the device, which is generated by the voltage difference between the source and the gate of the device. Pairs of different terminals of the device are isolated with a suitable dielectric material.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

FIG. 1 provides a cross-sectional side view illustrating an integrated circuit (IC) structure that includes an III-N transistor and a symmetric backside field plate structure, according to some embodiments of the present disclosure.

FIG. 2 provides cross-sectional side views illustrating an IC structure that includes an III-N transistor and an asymmetric backside field plate structure, according to some embodiments of the present disclosure.

FIGS. 4A-4C are various views illustrating different example stages in the manufacture of an IC structure using the method of FIG. 3, according to some embodiments of the present disclosure.

DETAILED DESCRIPTION

Overview

Figure 3:
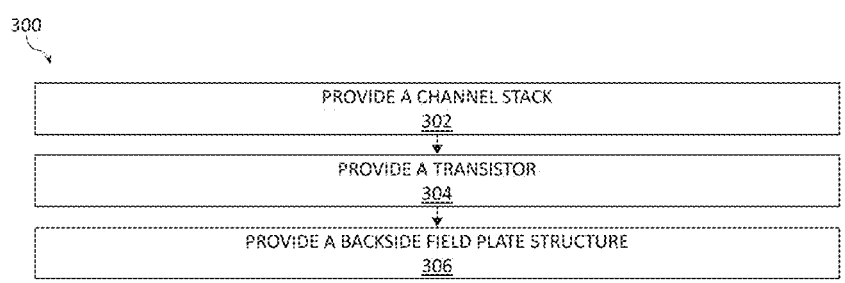
FIG. 3 is a flow diagram of an example method of manufacturing an IC structure that includes a transistor with at least one backside field plate structure, in accordance with various embodiments of the present disclosure.

Solid-state devices that can be used in high voltage and/or high frequency applications are of great importance in modern semiconductor technologies. For example, RF ICs (RFICs) and power management ICs (PMICs) may be critical functional blocks in system on a chip (SoC) implementations. Such SoC implementations may be found in mobile computing platforms such as smartphones, tablets, laptops, netbooks, and the like. In such implementations, the RFICs and PMICs are important factors for power efficiency and form factor, and can be equally or even more important than logic and memory circuits.

Due, in part, to their large band gap and high mobility, III-N material based transistors, such as gallium nitride (GaN) based transistors, may be particularly advantageous for high voltage and/or high frequency applications. For example, because GaN has a larger band gap (about 3.4 electronvolts (eV)) than silicon (Si; band gap of about 1.1 eV), a GaN transistor is expected to withstand a larger electric field (resulting, e.g., from applying a large voltage to the drain, Vdd) before suffering breakdown, compared to a Si transistor of similar dimensions. Furthermore, GaN transistors may advantageously employ a 2D electron gas (2DEG) (i.e., a group of electrons, an electron gas, free to move in two dimensions but tightly confined in the third dimension, e.g., a 2D sheet charge) as its transport channel, enabling high mobilities without using impurity dopants. For example, the 2D sheet charge may be formed at an abrupt heterojunction interface formed by deposition (e.g., epitaxial deposition), on GaN, of a charge-inducing film of a material having larger spontaneous and piezoelectric polarization, compared to GaN (such a film is generally referred to as a "polarization layer"). Providing a polarization layer on an III-N material such as GaN allows forming very high charge densities without intentionally added impurity dopants, which, in turn, enables high mobilities.

Despite the advantages, there are some challenges associated with III-N transistors which hinder their large-scale implementation. One such challenge resides in drain electric field concentrating at the edge of the gate and causing premature breakdown (i.e., decreasing the breakdown voltage). The breakdown voltage, commonly abbreviated as BVDS, refers to the drain-source voltage, VDS, which causes a transistor to enter the breakdown region (i.e., the region where the transistor receives too much voltage across its drain-source terminal, which causes the drain-source terminal to break down, which makes the drain current, ID, drastically increase).

To address this challenge, conventionally, a field plate in a form of a metal layers provided in the insulator material above the polarization layer, between the gate and the drain of a transistor, is built into the transistor structure, to manipulate the distribution of electric field at the transistor drain and thereby enhance the breakdown voltage of the transistor. Such an approach may limit the design freedom in controlling the electric field and may incur large parasitic capacitance, especially if wider, longer, and thicker metal layers are used as field plates.

Disclosed herein are IC structures, as well as packages and device assemblies that include such IC structures, implementing field plate structures (which may also be referred to, simply, as "field plates") in a form of electrically conductive structures provided in a III-N semiconductor material below the polarization layer (i.e., at the "backside" of an IC structure, if the "front" of the IC structure is where the gate of the top-gated III-N transistor is provided). An example IC structure includes a support structure (e.g., a substrate, a die, or a chip), an III-N transistor, and a backside field plate structure. The III-N transistor includes a channel stack of an III-N semiconductor material provided over the support structure and a polarization material provided over the III-N semiconductor material. The III-N transistor also includes first and second source/drain (S/D) regions provided in the channel stack, and a gate stack provided over a portion of the channel stack between the first and the second S/D regions. The field plate structure includes an electrically conductive structure, at least a portion of which is included in a portion of the III-N semiconductor material (i.e., under the polarization material and under the gate stack) between the first and second S/D regions. In some embodiments, the field plate structure may be implemented as a through-silicon via (TSV) extending from the back/bottom face of the support structure towards the III-N semiconductor material (i.e., extending through the support structure), where, as used herein, the term "TSV" does not imply that the support structure is necessarily made out of silicon, although in some embodiments, it might be (e.g., the support structure may be a silicon substrate). Providing such a backside field plate structure may provide a viable approach to changing the distribution of electric field at a transistor drain and increasing the breakdown voltage of a III-N transistor without incurring the large parasitic capacitances associated with the use of metal field plates provided above the polarization material. In addition, such a backside field plate structure may serve as a back barrier for advantageously reducing drain-induced barrier lowering (DIBL), an undesirable effect that may be observed in transistors, especially as gate lengths are being aggressively scaled down.

As used herein, the term "III-N semiconductor material" (in the following, also referred to simply as an "III-N material") refers to a compound semiconductor material with a first sub-lattice of at least one element from group III of the periodic table (e.g., Al, Ga, In) and a second sub-lattice of nitrogen (N). As used herein, the term "III-N transistor" refers to a device that includes an III-N material (which may include one or more different III-N materials, e.g., a plurality of different III-N materials stacked over one another) as an active material in which a conductive channel is formed during operation of the transistor.

While various embodiments described herein refer to III-N transistors (i.e., transistors employing one or more III-N materials as an active channel material), these embodiments are equally applicable to any other III-N devices besides III-N transistors, such as III-N diodes, sensors, light-emitting diodes (LEDs), and lasers (i.e., other device components employing one or more III-N materials as active materials), as well as to transistors that employ semiconductors other than III-N materials as channel materials. Furthermore, while the following discussions may refer to the two-dimensional charge carrier layers as "2DEG" layers, embodiments described herein are also applicable to systems and material combinations in which 2D hole gas (2DHG) may be formed, instead of 2DEG. Thus, unless stated otherwise, embodiments referring to 2DEG are equally applicable to implementing 2DHG instead, all of such embodiments being within the scope of the present disclosure.

Each of the structures, packages, methods, devices, and systems of the present disclosure may have several innovative aspects, no single one of which being solely responsible for the all of the desirable attributes disclosed herein. Details of one or more implementations of the subject matter described in this specification are set forth in the description below and the accompanying drawings.

In the following detailed description, various aspects of the illustrative implementations may be described using terms commonly employed by those skilled in the art to convey the substance of their work to others skilled in the art. For example, the term "connected" means a direct electrical or magnetic connection between the things that are connected, without any intermediary devices, while the term "coupled" means either a direct electrical or magnetic connection between the things that are connected, or an indirect connection through one or more passive or active intermediary devices. The term "circuit" means one or more passive and/or active components that are arranged to cooperate with one another to provide a desired function. If used, the terms "oxide," "carbide," "nitride," etc. refer to compounds containing, respectively, oxygen, carbon, nitrogen, etc. Similarly, the terms naming various compounds refer to materials having any combination of the individual elements within a compound (e.g., "gallium nitride" or "GaN" refers to a material that includes gallium and nitrogen, "aluminum indium gallium nitride" or "AlInGaN" refers to a material that includes aluminum, indium, gallium and nitrogen, and so on). Further, the term "high-k dielectric" refers to a material having a higher dielectric constant (k) than silicon oxide, while the term "low-k dielectric" refers to a material having a lower k than silicon oxide. The terms "substantially," "close," "approximately," "near," and "about," generally refer to being within +/−20%, preferably within +/−10%, of a target value based on the context of a particular value as described herein or as known in the art. Similarly, terms indicating orientation of various elements, e.g., "coplanar," "perpendicular," "orthogonal," "parallel," or any other angle between the elements, generally refer to being within +/−5-20% of a target value based on the context of a particular value as described herein or as known in the art.

The terms such as "over," "under," "between," and "on" as used herein refer to a relative position of one material layer or component with respect to other layers or components. For example, one layer disposed over or under another layer may be directly in contact with the other layer or may have one or more intervening layers. Moreover, one layer disposed between two layers may be directly in contact with one or both of the two layers or may have one or more intervening layers. In contrast, a first layer described to be "on" a second layer refers to a layer that is in direct contact with that second layer. Similarly, unless explicitly stated otherwise, one feature disposed between two features may be in direct contact with the adjacent features or may have one or more intervening layers.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The term "between," when used with reference to measurement ranges, is inclusive of the ends of the measurement ranges. As used herein, the notation "A/B/C" means (A), (B), and/or (C).

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous. The disclosure may use perspective-based descriptions such as "above," "below," "top," "bottom," and "side"; such descriptions are used to facilitate the discussion and are not intended to restrict the application of disclosed embodiments. The accompanying drawings are not necessarily drawn to scale. Unless otherwise specified, the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

In the following detailed description, reference is made to the accompanying drawings that form a part hereof, and in which is shown, by way of illustration, embodiments that may be practiced. It is to be understood that other embodiments may be utilized, and structural or logical changes may be made without departing from the scope of the present disclosure. Therefore, the following detailed description is not to be taken in a limiting sense. For convenience, if a collection of drawings designated with different letters are present, e.g., FIGS. 5A-5B, such a collection may be referred to herein without the letters, e.g., as "FIG. 5." In the drawings, same reference numerals refer to the same or analogous elements/materials shown so that, unless stated otherwise, explanations of an element/material with a given reference numeral provided in context of one of the drawings are applicable to other drawings where element/materials with the same reference numerals may be illustrated.

In the drawings, some schematic illustrations of example structures of various structures, devices, and assemblies described herein may be shown with precise right angles and straight lines, but it is to be understood that such schematic illustrations may not reflect real-life process limitations which may cause the features to not look so "ideal" when any of the structures described herein are examined using e.g., scanning electron microscopy (SEM) images or transmission electron microscope (TEM) images. In such images of real structures, possible processing defects could also be visible, e.g., not-perfectly straight edges of materials, tapered vias or other openings, inadvertent rounding of corners or variations in thicknesses of different material layers, occasional screw, edge, or combination dislocations within the crystalline region(s), and/or occasional dislocation defects of single atoms or clusters of atoms. There may be other defects not listed here but that are common within the field of device fabrication.

Various operations may be described as multiple discrete actions or operations in turn in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

Various IC structures that include at least one transistor with a backside field plate structure as described herein may be implemented in one or more components associated with an IC or/and between various such components. In various embodiments, components associated with an IC include, for example, transistors, diodes, power sources, resistors, capacitors, inductors, sensors, transceivers, transmitters, receivers, antennas, etc. Components associated with an IC may include those that are mounted on an IC, provided as an integral part of an IC, or those connected to an IC. The IC may be either analog or digital, or may include a combination of analog and digital circuitry, and may be used in a number of applications, such as microprocessors, optoelectronics, logic blocks, audio amplifiers, etc., depending on the components associated with the IC. In some embodiments, IC structures as described herein may be included in a RFIC, which may, e.g., be included in any component associated with an IC of an RF receiver, an RF transmitter, or an RF transceiver, or any other RF device, e.g., as used in telecommunications within base stations (BS) or user equipment (UE) devices. Such components may include, but are not limited to, RF switches, power amplifiers, low-noise amplifiers, RF filters (including arrays of RF filters, or RF filter banks), upconverters, downconverters, and duplexers. In some embodiments, the IC structures as described herein may be employed as part of a chipset for executing one or more related functions in a computer.

Integrating a Backside Field Plate Structure with an III-N Transistor

Two variations of a backside field plate structure are presented herein. One is a structure that is substantially symmetric in shape, which may have an advantage of simpler manufacturing. An example of such structure is shown in FIG. 1. Another one is a structure that has an asymmetric shape, which may advantageously be optimized in terms of certain performance parameters. An example of such structure is shown in FIG. 2.

FIG. 1 provides a cross-sectional side view illustrating an IC structure 100 that includes an III-N transistor 102 integrated with a substantially symmetric backside field plate structure 104, according to some embodiments of the present disclosure. A legend provided within a dashed box at the bottom of FIG. 1 illustrates colors/patterns used to indicate some classes of materials of some of the elements shown in FIG. 1, so that FIG. 1 is not cluttered by too many reference numerals. For example, FIG. 1 uses different colors/patterns to identify a support structure 108, an insulator 110, an III-N material 112, a polarization material 114, source/drain (S/D) regions 116 of the III-N transistor 102, an electrically conductive material 118 used to implement contacts to various transistor terminals, a gate dielectric material 120, a gate electrode material 122, and a buffer material 124.

The support structure 108 may be any suitable structure, e.g., a substrate, a die, or a chip, on which III-N transistors as described herein may be implemented. In some embodiments, the support structure 108 may include a semiconductor, such as silicon. In other implementations, the support structure 108 may include/be alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-N or group IV materials.

In some embodiments, the support structure 108 may include a ceramic material, or any other non-semiconductor material. For example, in some embodiments, the support structure 108 may include glass, a combination of organic and inorganic materials, embedded portions having different materials, etc. Although a few examples of materials from which the support structure 108 may be formed are described here, any material that may serve as a foundation upon which at least one III-N transistor as described herein may be built falls within the spirit and scope of the present disclosure.

In some embodiments, an insulator 110 may be provided in various portions of the IC structure 100, e.g., encompassing various portions of the III-N transistor 102, as shown in FIG. 1. Examples of the insulator 110 may include silicon oxide, silicon nitride, aluminum oxide, silicon oxynitride, or any other suitable interlayer dielectric (ILD) materials used in semiconductor manufacturing. Although not specifically shown in FIG. 1, in some embodiments, an insulating layer, e.g., a layer of the insulator 110, may be provided between the support structure 108 and the III-N material 112. Such an insulating layer may, e.g., include an oxide isolation layer, and may be used to electrically isolate the semiconductor material of the support structure 108 from other regions of or surrounding the III-N transistor 102. Providing such an insulating layer over the support structure 108 and below the III-N transistor 102 may help mitigate the likelihood that undesirable conductive pathways will form through the support structure 108 (e.g., a conductive pathway between the S/D regions 116 of the III-N transistor 102).

A channel stack of the III-N transistor 102 may be considered to include an III-N semiconductor material 112 and a polarization layer 114.

In some embodiments, the III-N material 112 may be formed of a compound semiconductor with a first sub-lattice of at least one element from group III of the periodic table (e.g., Al, Ga, In), and a second sub-lattice of nitrogen (N). In some embodiments, the III-N material 112 may be a binary, ternary, or quaternary III-N compound semiconductor that is an alloy of two, three, or even four elements from group III of the periodic table (e.g., boron, aluminum, indium, gallium) and nitrogen.

In general, the III-N material 112 may be composed of various III-N semiconductor material systems including, for example, N-type or P-type III-N materials systems, depending on whether the III-N transistor 102 is an N-type or a P-type transistor. For some N-type transistor embodiments, the III-N material 112 may advantageously be an III-N material having a high electron mobility, such a, but not limited to GaN. In some embodiments, the III-N material 112 may be a ternary III-N alloy, such as InGaN, or a quaternary III-N alloy, such as AlInGaN.

In some embodiments, the III-N material 112 may be formed of a highly crystalline semiconductor, e.g., of substantially a monocrystalline semiconductor (possibly with some limited amount of defects, e.g., dislocations). The quality of the III-N material 112 (e.g., in terms of defects or crystallinity) may be higher than that of other III-N materials of, or near, the III-N transistor 102 since, during the operation of the III-N transistor 102, a transistor channel will form in the III-N material 112. A portion of the III-N material 112 where a transistor channel of the III-N transistor 102 forms during operation may be referred to as a "III-N channel material/region" of the III-N transistor 102.

In some embodiments, the III-N material 112 may be an intrinsic III-N semiconductor material or alloy, not intentionally doped with any electrically active impurity. In alternate embodiments, one or more a nominal impurity dopant level may be present within the III-N material 112, for example to set a threshold voltage Vt of the III-N transistor 102, or to provide halo pocket implants, etc. In such impurity-doped embodiments however, impurity dopant level within the III-N material 112 may be relatively low, for example below $10^{15}$ dopants per cubic centimeter ($cm^{-3}$), or below $10^{13}$ $cm^{-3}$.

In various embodiments, a thickness of the III-N material 112 may be between about 5 and 2000 nanometers, including all values and ranges therein, e.g., between about 50 and 1000 nanometers, or between about 10 and 50 nanometers. Unless specified otherwise, all thicknesses described herein refer to a dimension measured in a direction perpendicular to the support structure 108 (i.e., measured along the z-axis of the example coordinate system shown in FIG. 1).

Turning now to the polarization material 114 of the III-N transistor 102, in general, the polarization material 114 may be a layer of a charge-inducing film of a material having larger spontaneous and/or piezoelectric polarization than that of the bulk of the III-N layer material immediately below it (e.g., the III-N material 112), creating a heterojunction (i.e., an interface that occurs between two layers or regions of semiconductors having unequal band gaps) with the III-N material 112, and leading to formation of 2DEG at or near (e.g., immediately below) that interface, during operation of the III-N transistor 102. In some embodiments, the polarization material 114 may be any suitable material configured to induce a tensile stress in the III-N semiconductor material 112. As a result, as described above, a 2DEG layer may be formed during operation of an III-N transistor in a layer of an III-N semiconductor material immediately below a suitable polarization layer. In various embodiments, the polarization material 114 may include materials such as AlN, InAlN, AlGaN, or $Al_xIn_yGa_{1-x-y}N$, and may have a thickness (dimension 132 shown in FIG. 1) that is, e.g., between about 1 and 100 nanometers, including all values and ranges therein, e.g., between about 5 and 50 nanometers or between about 10 and 30 nanometers. A gate stack 128 may be provided in a recess in the polarization material 114, in which case a thickness of the polarization material 114 between the gate stack 128 and the III-N material 112 (dimension 134 shown in FIG. 1) may be between about 1 and 25 nanometers, including all values and ranges therein, e.g., between about 1 and 15 nanometers, between about 1 and 4 nanometers, between about 2 and 5 nanometers, between about 8 and 12 nanometers, or between about 12 and 13 nanometers.

As also shown in FIG. 1, the III-N transistor 102 may include two S/D regions 116, where one of the S/D regions 116 is a source region and another one is a drain region, where the "source" and the "drain" designations may be interchangeable. As is well-known, in a transistor, S/D regions (also sometimes interchangeably referred to as "diffusion regions") are regions that can supply charge carriers for the transistor channel (e.g., the transistor channel 112) of the transistor (e.g., the III-N transistor 102). In some embodiments, the S/D regions 116 may include highly doped semiconductor materials, such as highly doped InGaN. Often, the S/D regions may be highly doped, e.g., with dopant concentrations of at least above $1.10^{21}$ $cm^{-3}$, in order to advantageously form Ohmic contacts with the respective S/D electrodes of the III-N transistor 102 (e.g., electrodes 126 shown in FIG. 1, made of the electrically conductive material 118), although these regions may also have lower dopant concentrations in some implementations. Regardless of the exact doping levels, the S/D regions 116 are the regions having dopant concentration higher than in other regions between the source region (e.g., the S/D region 116 shown on the left side in FIG. 1) and the drain region (e.g., the S/D region 116 shown on the right side in FIG. 1), i.e., higher than the III-N material 112. For that reason, sometimes the S/D regions are referred to as highly doped (HD) S/D regions. In further embodiments, one or more layers of metal and/or metal alloys may be used to form the S/D regions 116.

The electrically conductive material 118 of the S/D electrodes 126 may include any suitable electrically conductive material, alloy, or a stack of multiple electrically conductive materials. In some embodiments, the electrically conductive material 118 may include one or more metals or metal alloys, with metals such as copper, ruthenium, palladium, platinum, cobalt, nickel, hafnium, zirconium, titanium, tantalum, and aluminum, tantalum nitride, titanium nitride, tungsten, doped silicon, doped germanium, or alloys and mixtures of these. In some embodiments, the electrically conductive material 118 may include one or more electrically conductive alloys, oxides, or carbides of one or more metals. In some embodiments, the electrically conductive material 118 may include a doped semiconductor, such as silicon or another semiconductor doped with an N-type dopant or a P-type dopant. Metals may provide higher conductivity, while doped semiconductors may be easier to pattern during fabrication. In some embodiments, the S/D electrodes 126 may have a thickness between about 2 nanometers and 1000 nanometers, preferably between about 2 nanometers and 100 nanometers. FIG. 1 further illustrates that the electrically conductive material 118 may also be used to form electrical contact to the gate electrode of the III-N transistor 102 (i.e., in general, the electrically conductive material 118 may also be used to form electrical contacts to any of the transistor terminals of the III-N transistor 102). In various embodiments, the exact material compositions of the electrically conductive material 118 may be different when used to implement contacts to different electrodes of different transistors within the IC structure 100.

FIG. 1 further illustrates a gate stack 128 provided over a portion of the channel stack that includes the polarization material 114 and the III-N material 112, between the pair of the S/D regions 116. The gate stack 128 may include a layer of a gate dielectric material 120, and a gate electrode material 122. In some embodiments, a width of the gate stack (dimension 136 shown in FIG. 1) may be between about 30 and 2000 nanometers, including all values and ranges therein, e.g., between about 30 and 250 nanometers, or between about 70 and 120 nanometers. In some embodiments, the distances from the gate stack 128 to each of the S/D regions 116 may be substantially equal. In other embodiments, the distance from the gate stack 128 to a first one of the S/D regions 116 (e.g., the one shown on the left side in FIG. 1, in which case the distance is dimension 138 shown in FIG. 1) may be different from, e.g., smaller than the distance from the gate stack 128 to a second one of the S/D regions 116 (e.g., the one shown on the right side in FIG. 1, in which case the distance is dimension 140 shown in FIG. 1).

The gate dielectric material 120 may be a high-k dielectric material, e.g., a material including elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric material 120 may include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, tantalum oxide, tantalum silicon oxide, lead scandium tantalum oxide, and lead zinc niobate. In some embodiments, an annealing process may be carried out on the gate dielectric material 120 during manufacture of the III-N transistor 102 to improve the quality of the gate dielectric material 120. A thickness of the gate dielectric material 120 may be between 0.5 nanometers and 3 nanometers, including all values and ranges therein, e.g., between 1 and 3 nanometers, or between 1 and 2 nanometers.

The gate electrode material 122 may include at least one P-type work function metal or N-type work function metal, depending on whether the III-N transistor 102 is a P-type metal-oxide-semiconductor (MOS) (PMOS) transistor or an N-type MOS (NMOS) transistor (e.g., P-type work function metal may be used as the gate electrode material 122 when the transistors 102 is a PMOS transistor and N-type work function metal may be used as the gate electrode material 122 when the III-N transistor 102 is an NMOS transistor, depending on the desired threshold voltage). For a PMOS transistor, metals that may be used for the gate electrode material 122 may include, but are not limited to, ruthenium, palladium, platinum, cobalt, nickel, titanium nitride, and conductive metal oxides (e.g., ruthenium oxide). For an NMOS transistor, metals that may be used for the gate electrode material 122 include, but are not limited to, hafnium, zirconium, titanium, tantalum, aluminum, alloys of these metals, carbides of these metals (e.g., hafnium carbide, zirconium carbide, titanium carbide, tantalum carbide, and aluminum carbide), and nitrides of these metals (e.g., tantalum nitride, and tantalum aluminum nitride). In some embodiments, the gate electrode material 122 may include a stack of two or more metal layers, where one or more metal layers are work function metal layers and at least one metal layer is a fill metal layer.

Further layers may be included next to the gate electrode material 122 for other purposes, such as to act as a diffusion barrier layer or/and an adhesion layer, not specifically shown in FIG. 1. Furthermore, in some embodiments, the gate dielectric material 120 and the gate electrode material 122 may be surrounded by a gate spacer, not shown in FIG. 1, configured to provide separation between the gates of different transistors. Such a gate spacer may be made of a low-k dielectric material (i.e., a dielectric material that has a lower dielectric constant (k) than silicon dioxide which has a dielectric constant of 3.9). Examples of low-k materials that may be used as the dielectric gate spacer may include, but are not limited to, fluorine-doped silicon dioxide, carbon-doped silicon dioxide, spin-on organic polymeric dielectrics such as polyimide, polynorbornenes, benzocyclobutene, and polytetrafluoroethylene (PTFE), or spin-on silicon-based polymeric dielectric such as hydrogen silsesquioxane (HSQ) and methylsilsesquioxane (MSQ)). Other examples of low-k materials that may be used as the dielectric gate spacer include various porous dielectric materials, such as for example porous silicon dioxide or porous carbon-doped silicon dioxide, where large voids or pores are created in a dielectric in order to reduce the overall dielectric constant of the layer, since voids can have a dielectric constant of nearly 1.

In some embodiments, the IC structure 100 may, optionally, include a buffer material 124 between the III-N material 112 and the support structure 108. In some embodiments, the buffer material 124 may be a layer of a semiconductor material that has a band gap larger than that of the III-N material 112, so that the buffer material 124 can serve to prevent current leakage from the future III-N transistor to the support structure 108. Furthermore, a properly selected semiconductor for the buffer material 124 may enable better epitaxy of the III-N material 112 thereon, e.g., it may improve epitaxial growth of the III-N material 112, for instance in terms of a bridge lattice constant or amount of defects. For example, a semiconductor that includes aluminum, gallium, and nitrogen (e.g., AlGaN) or a semiconductor that includes aluminum and nitrogen (e.g., AlN) may be used as the buffer material 124 when the III-N material 112 is a semiconductor that includes gallium and nitrogen (e.g., GaN). Other examples of materials for the buffer material 124 may include materials typically used as ILD, described above, such as oxide isolation layers, e.g., silicon oxide, silicon nitride, aluminum oxide, and/or silicon oxynitride. When implemented in the III-N transistor 102, the buffer material 124 may have a thickness between about 100 and 5000 nm, including all values and ranges therein, e.g., between about 200 and 1000 nanometers, or between about 250 and 500 nanometers.

Turning to the details of the field plate structure 104, the example shown in FIG. 1 illustrates that the field plate 104 may be implemented as having a portion in the support structure 108 and a portion in the III-N material 112. For example, in some embodiments, considering that the support structure has a first face 152 and an opposite second face 154, where the first face 152 is the front face because this is where the III-N transistor 102 is implemented, and where the second face 154 is then the back face, the field plate structure 104 may extend from the back face 154 of the support structure 108 to the front face 152 of the support structure 108, and into a portion of the III-N material 112 under the gate stack 128, e.g., as a TSV, shown in FIG. 1. Such an implementation where the field plate structure 104 connects to the back face 154 may be particularly advantageous for coupling the field plate structure 104 to a bias source so that bias voltage may be applied to the structure 104 during operation of the III-N transistor 102. However, in other embodiments, the field plate structure 104 may adopt any other suitable geometry, as long as it has a portion in the III-N semiconductor material 112 that at least partially overlaps with the gate stack 128, and as long as it may be coupled to a bias source (e.g., using any suitable interconnect scheme as known in the art).

The field plate structure 104 is configured to be coupled to a bias source and receive bias voltage by being implemented as an electrically conductive structure. In some embodiments, the field plate structure 104 may be fabricated as an opening, e.g., a via opening, filled with an electrically conductive material, e.g., filled with the electrically conductive material 118, as shown in the example of FIG. 1, which material may, but does not have to have the same material composition as that used to form electrodes to various transistor terminals. In other embodiments, the field plate structure 104 may be fabricated as an opening, e.g., a via opening, only lined with such an electrically conductive material, the opening being further filled with any other suitable filler material, which may but does not have to be electrically conductive. Any suitable manners for implementing electrically conductive structures may be used for fabricating the field plate structure 104 as described herein, all of which being within the scope of the present disclosure. Furthermore, although not specifically shown in FIG. 1 (or other drawings), in some embodiments, the field plate structure 104 may include a layer of a dielectric, e.g., oxide, material provided between at least some portions of the electrically conductive material of the field plate structure 104 and the rest of the material(s) surrounding the field plate structure 104. For example, such a layer of a dielectric, e.g., oxide, material may be provided between the field plate structure 104 and the III-N semiconductor material 112. In some embodiments, a thickness of such a dielectric layer may be between about 1 and 10 nanometers, including all values and ranges therein, e.g., between about 1 and 8 nanometers, or between about 1 and 5 nanometers.

In general, the geometry (e.g., shape and dimensions) and the location of the field plate structure 104 provided below the polarization layer 114 of the III-N transistor 102 as described herein may be selected to be suitable for the use of the field plate structure 104 as will now be explained.

The maximum reverse operating voltage of a transistor is tightly linked to the maximum operating voltage of an IC. A way to enhance the breakdown voltage is to manipulate the field distribution in a transistor channel at reverse bias voltage. The backside field plate structure 104 provides means to distribute the field across the transistor channel, thereby extending its safe operating voltage range. In addition, such a backside field plate structure may also advantageously serve as a back barrier for suppressing DIBL in forward operation. By placing the backside field plate structure 104 so that at least a portion of it is in the III-N material 112 underneath the active channel region of a transistor (i.e., under at least a portion of the gate stack 128, e.g., overlapping by a distance 142 shown in FIG. 1) and by biasing, during operation of the transistor 102, the backside field plate structure 104 at a potential having the absolute value (abs(Vfp)) that is above 0V and below the absolute value of the gate voltage Vgs (abs(Vgs)) (e.g., a potential between 0V and negative gate voltage—Vgs) allows spreading out the electric field at reverse bias, which may advantageously allow suppressing high breakdown fields. In forward operation, the backside field plate structure 104 may help to reduce DIBL, i.e., the gate control of the channel may be enhanced due to the potential between 0V and Vgs being applied to the backside field plate structure 104. In some embodiments, during operation of the transistor 102, the backside field plate structure 104 may be bias at a potential that is an intermediate voltage between Vds and Vgs. In various embodiments, the backside field plate structure 104 as described herein may be used for, both, the depletion mode transistors (i.e., transistors for which a threshold voltage is below 0 volts) and enhancement mode transistors (i.e., transistors for which a threshold voltage is above 0 volts).

In order to achieve the functionality of the backside field plate structure 104 as described above, the backside field plate structure 104 is to be placed sufficiently close to the gate stack 128. In some embodiments, an overlap (dimension 142 shown in FIG. 1) between the gate stack 128 and the portion of the field plate structure 104 that is in the III-N material 112 may be between about 20 and 80 percent of a width of the gate stack (i.e., the dimension 136, described above), including all values and ranges therein, e.g., between about 20 and 30 percent, between about 30 and 70 percent, or between about 40 and 60 percent. Thus, in some embodiments, between about 20 and 80% of the width of the gate stack 128 may be "covered," at the backside, by the field plate structure 104 provided below the polarization material 114 and facing the gate stack 128. For example, if the gate stack 128 has the width 136 of about 90 nanometers, then, in some embodiments, the overlap 142 may be between about 15 or 18 and 70 nanometers, including all values and ranges therein, e.g., between about 20 and 50 nanometers, or between about 18 and 30 nanometers.

Having the overlap 142 that is between about 20 and 80 percent of the width of the gate stack 128 means that not all of the field plate structure 104 may be underneath the gate stack 128. In other words, one side wall of the field plate structure 104 may be under the gate stack 128, e.g., the side wall 156 shown in FIG. 1, while the other side wall (e.g., the side wall 158 shown in FIG. 1, opposite the first side wall 156) may be in a portion of the III-N material 112 between the first side wall and the second S/D region 116 (i.e., the S/D region 116 shown on the right side of FIG. 1). Having a portion of the field plate structure 104 that extends from underneath the gate stack 128 towards one of the S/D regions 116 (as shown in FIG. 1), which may be either source or drain region, may allow distributing the electric field in the 2DEG channel under reverse bias such that the maximum electric field under reverse bias would not exceed a fraction of the critical breakdown field in regions 112 and 114. If the S/D region 116 towards which the field plate structure 104 extends from underneath the gate stack 128 is a source region, then the field plate structure 104 may be referred to as a "source-side field plate" and the overlap 140 may be seen as being on the source-side of the channel region of the transistor 102, while if the S/D region 116 towards which the field plate structure 104 extends from underneath the gate stack 128 is a drain region, then the field plate structure 104 may be referred to as a "drain-side field plate" and the overlap 140 may be seen as being on the drain-side of the channel region of the transistor 102.

In some embodiments, a width of the portion of the field plate structure 104 that is in the III-N material 112 and is facing the gate stack 128 (dimension 144 shown in FIG. 1) may be between about 20 and 80 percent of the distance between the gate stack 128 and the second S/D region 116 (i.e., the dimension 140, described above), including all values and ranges therein, e.g., between about 30 and 70 percent, or between about 40 and 60 percent.

The field plate structure 104 may be placed sufficiently close to the channel region of the transistor 102 in order to be able to influence the electric field distribution as described above. For example, in some embodiments, a distance (dimension 146 shown in FIG. 1) from the field plate structure 104 to the polarization material 114 may be between about 20 and 200 percent of the thickness of the polarization material 114 between the gate stack 128 and the S/D regions 116 (i.e., the thickness 132, described above), including all values and ranges therein, e.g., between about 30 and 100 percent, or between about 50 and 80 percent. For example, if the thickness 132 of the polarization material 114 about 20 nanometers, then, in some embodiments, the distance 146 may be between about 4 and 40 nanometers from the polarization material 114, including all values and ranges therein, e.g., between about 10 and 30 nanometers, or between about 15 and 25 nanometers.

In various embodiments, the shape of the field plate structure 104 may be engineered to optimize performance of the transistor 102 in terms of various parameters. For example, in order to increase the maximum reverse operation voltage, the distance 142 (i.e., field plate to channel overlap) may be increased, while the distance 146 (i.e., field plate to channel spacing) may be decreased. In another example, in order to reduce field plate capacitance, the distance 142 (i.e., field plate to channel overlap) may be decreased, while the distance 146 (i.e., field plate to channel spacing) may be increased. In other examples, in order to reduce source-to-drain leakage, the distance 144 (i.e., field plate width) may be reduced; in order to reduce field plate to channel leakage, the distance 146 (i.e., field plate to channel spacing) may be increased, etc.

Although not specifically shown in FIG. 1, the IC structure 100 may further include additional transistors similar to the III-N transistor 102 and additional backside field plate strictures similar to field plate structure 104, described above.

In some embodiments, the IC structure 100 may be included in, or used to implement at least a portion of an RF FE. In some embodiments, the III-N transistor 102 of the IC structure 100 may be included in, or used to implement at least a portion of an RF circuit or a part of a power circuit included in the IC structure.

While the field plate structure 104 shown in FIG. 1 is substantially symmetric, in particular, all of the points of the upper boundary of the upper portion of the field plate structure 104 (i.e., the portion of the field plate structure 104 shown in FIG. 1 that is in the III-N material 112) are at substantially the same distance 146 from the polarization material 114, this does not have to be the case. In fact, in some embodiments, the shape of the upper portion of the field plate structure 104 (i.e., the portion of the field plate structure 104 that is closest to the polarization material 114) may be engineered to further optimize performance of the transistor 102 in terms of various desired parameters, e.g., capacitance at matched breakdown voltage. An example of this principle is illustrated in FIG. 2, showing an example of an IC structure 200 that includes the III-N transistor 102 as described above and an asymmetric backside field plate structure 204. The IC structure 200 is similar to the IC structure 100 where the same numbers illustrate analogous elements. Therefore, in the interests of brevity, descriptions of those elements provided for the IC structure 100 shown in FIG. 1 are assumed to be applicable to the IC structure 200 shown in FIG. 2 and only the differences between these IC structures are described below.

Namely, the field plate structure 204 is substantially similar to the field plate structure 104 except that the upper portion of the field plate structure 204 is asymmetric. In particular, in some embodiments, different points of the upper boundary of the upper portion of the field plate structure 204 (i.e., the portion of the field plate structure 204 that is in the III-N material 112) may be at different distances from the polarization material 114. FIG. 2 illustrates an example where the upper boundary of the field plate structure 204 may have a first portion that is at a first distance 246-1 from the polarization material 114, and may have a second portion that is at a second distance 246-2 from the polarization material 114, where the first distance 246-1 is smaller than the second distance 246-2. In some embodiments, the first distance 246-1 may be between about 20 and 200 percent of the second distance 246-2, including all values and ranges therein, e.g., between about 30 and 150 percent, or between about 40 and 60 percent. For example, the first distance 246-1 may be between about 2 and 40 nanometers, including all values and ranges therein, e.g., between about 6 and 30 nanometers, or between about 8 and 12 nanometers, while the second distance 246-2 may be between about 10 and 40 nanometers, including all values and ranges therein, e.g., between about 20 and 40 nanometers, or between about 12 and 18 nanometers.

For example, in some embodiments, the first portion that is at the first distance 246-1 from (i.e., closer to) the polarization material 114 may be closer to the gate stack 128, e.g., may be substantially underneath the gate stack 128, than the second portion that is at the second distance 246-1 (i.e., further away) from the polarization material 114. In some such embodiments, the S/D region 116 shown on the left side of FIG. 2 may be a source region, and the other S/D region 116 may be the drain region (i.e., the field plate structure 204 may be a drain-side field plate, as described above). Thus, in some embodiments, the shape of the field plate structure 204 may be engineered so that the distance from the field plate structure 204 to the polarization material 114 is smallest at a portion of the field plate structure closest to the gated channel and tapers off towards the drain region, which may provide benefit in terms of capacitance at matched breakdown voltage.

In some embodiments, the upper portion of the field plate structure 204 (i.e., again, the portion of the field plate structure 104 that is closest to the polarization material 114) can be engineered such that the point where the distance from the field plate structure 204 to the polarization material 114 is the smallest (i.e., the point at which the distance 246-1 shown in FIG. 2 is measured) may substantially coincide with the location of the maximum electric field that may form during reverse operation at particular locations in the materials 112 and 114. In some embodiments, other parts of the field plate structure 204 can be engineered to increase the distance 246-2 (i.e., channel-to-field plate separation), e.g., to reduce field plate to channel overlap capacitance.

Further Variations in Implementations of IC Structures with Backside Field Plate Structures Backside field plate structures as described above may be particularly beneficial for III-N transistors in that it may optimize the use of the 2DEG. However, in general, the backside field plate structures as described herein may also be integrated with non-III-N FETs, all of which implementations being within the scope of the present disclosure. Thus, in some embodiments of the IC structures 100 and 200, the transistor 102 described above may be a transistor implementing any other semiconductor material besides a III-N material, in which the channel stack of the transistor may not include the polarization material 114 as described above, the III-N material 112 described above would be replaced with a suitable other (non-III-N) channel material, and the material of the S/D regions 116 might also be replaced with a suitable other S/D region material. The rest of the descriptions provided above would be applicable to such non-III-N transistor embodiments. Some example materials which may be used as the non-III-N semiconductor material of the channel stack of the transistor 102 described above and may serve as a channel material of the non-III-N transistor 102 will now be described.

In various embodiments, the non-III-N semiconductor material of the channel stack of the transistor 102 described above may be composed of semiconductor material systems including, for example, N-type or P-type materials systems. In some embodiments, such a non-III-N semiconductor material may be formed of a monocrystalline semiconductor. In some embodiments, such a non-III-N semiconductor material may have a thickness between about 5 and 10000 nanometers, including all values and ranges therein, e.g., between about 10 and 500 nanometers, or between about 10 and 50 nanometers.

In some embodiments, the support structure over which such a non-III-N semiconductor material may be provided may be any structure suitable for supporting the non-III-N semiconductor material. In some embodiments, such a support structure may include a semiconductor, such as silicon, and the non-III-N semiconductor material of the channel stack of the transistor 102 described above may be an upper layer of said semiconductor (i.e., the non-III-N semiconductor material of the channel stack of the transistor 102 described above may be silicon, e.g., an upper layer of silicon of a silicon substrate). Thus, in some implementations, such a non-III-N semiconductor material may be viewed as a part of the support structure over which it is provided, or as a part of the crystalline semiconductor upper part of such support structure.

In some embodiments, the non-III-N semiconductor material of the channel stack of the transistor 102 described above may be/include an intrinsic IV or III-V semiconductor material or alloy, not intentionally doped with any electrically active impurity. In alternate embodiments, nominal impurity dopant levels may be present within such a non-III-N semiconductor material, for example to set a threshold voltage Vt, or to provide halo pocket implants, etc. In such impurity-doped embodiments however, impurity dopant level within the non-III-N semiconductor material may be relatively low, for example below about $10^{15}$ cm$^{-3}$, and advantageously below $10^{13}$ cm$^{-3}$.

In some embodiments, the non-III-N semiconductor material of the channel stack of the transistor 102 described above may be formed of a compound semiconductor with a first sub-lattice of at least one element from group III of the periodic table (e.g., Al, Ga, In), and a second sub-lattice of at least one element of group V of the periodic table (e.g., P, As, Sb). In some embodiments, such a non-III-N semiconductor material may be a binary, ternary, or quaternary III-V compound semiconductor that is an alloy of two, three, or even four elements from groups III and V of the periodic table, including boron, aluminum, indium, gallium, nitrogen, arsenic, phosphorus, antimony, and bismuth.

For exemplary P-type transistor embodiments, the non-III-N semiconductor material of the channel stack of the transistor 102 described above may advantageously be a group IV material having a high hole mobility, such as, but not limited to, Ge or a Ge-rich SiGe alloy. For some exemplary embodiments, such a non-III-N semiconductor material may have a Ge content between 0.6 and 0.9, and advantageously is at least 0.7.

For exemplary N-type transistor embodiments, the non-III-N semiconductor material of the channel stack of the transistor 102 described above may advantageously be a III-V material having a high electron mobility, such as, but not limited to InGaAs, InP, InSb, and InAs. For some such embodiments, such a non-III-N semiconductor material may be a ternary III-V alloy, such as InGaAs or GaAsSb. For some $In_xGa_{1-x}As$ fin embodiments, In content in the non-III-N semiconductor material may be between 0.6 and 0.9, and advantageously at least 0.7 (e.g., $In_{0.7}Ga_{0.3}As$).

In some embodiments, the non-III-N semiconductor material of the channel stack of the transistor 102 described above may be a thin-film material, in which embodiments the transistor 102 could be a thin-film transistor (TFT). A TFT may be a special kind of a FET, made by depositing a thin film of an active semiconductor material, as well as a dielectric layer and metallic contacts, over a support structure that may be a non-conducting (and non-semiconducting) support structure. During operation of a TFT, at least a portion of the active semiconductor material forms a channel of the TFT, and, therefore, the thin film of such active semiconductor material may be referred to as a "TFT channel material." In various such embodiments, the thin-film non-III-N semiconductor material of the channel stack of the transistor 102 described above may include a high mobility oxide semiconductor material, such as tin oxide, antimony oxide, indium oxide, indium tin oxide, titanium oxide, zinc oxide, indium zinc oxide, indium gallium zinc oxide (IGZO), gallium oxide, titanium oxynitride, ruthenium oxide, or tungsten oxide. In general, the non-III-N semiconductor material of the channel stack of the transistor 102 described above may include one or more of tin oxide, cobalt oxide, copper oxide, antimony oxide, ruthenium oxide, tungsten oxide, zinc oxide, gallium oxide, titanium oxide, indium oxide, titanium oxynitride, indium tin oxide, indium zinc oxide, nickel oxide, niobium oxide, copper peroxide, IGZO, indium telluride, molybdenite, molybdenum diselenide, tungsten diselenide, tungsten disulfide, N- or P-type amorphous or polycrystalline silicon, germanium, indium gallium arsenide, silicon germanium, gallium nitride, aluminum gallium nitride, indium phosphide, and black phosphorus, each of which may possibly be doped with one or more of gallium, indium, aluminum, fluorine, boron, phosphorus, arsenic, nitrogen, tantalum, tungsten, and magnesium, etc.

The IC structures 100/200 illustrated in FIGS. 1-2, and further embodiments of such IC structures, described above, do not represent an exhaustive set of assemblies in which one or more transistors with backside field plate structures may be provided as described herein, but merely provide examples of such structures/assemblies. Although particular arrangements of materials are discussed with reference to FIGS. 1-2, intermediate materials may be included in various portions of these figures. Note that FIGS. 1-2 are intended to show relative arrangements of some of the components therein, and that various device components of these figures may include other components that are not specifically illustrated, e.g., various interfacial layers or various additional layers or elements. For example, although not specifically shown, the IC structures 100, 200 may include a solder resist material (e.g., polyimide or similar material) and one or more bond pads formed on upper-most interconnect layer of the IC structure, e.g., at the top of the IC structures 100/200 shown in FIGS. 1-2. The bond pads may be electrically coupled with a further interconnect structure and configured to route the electrical signals between the transistor 102 and other external devices. For example, solder bonds may be formed on the one or more bond pads to mechanically and/or electrically couple a chip including the IC structure 100/200 with another component (e.g., a circuit board). The IC structure 100/200 may have other alternative configurations to route the electrical signals from the interconnect layers, e.g., the bond pads described above may be replaced by or may further include other analogous features (e.g., posts) that route the electrical signals to external components.

Additionally, although some elements of the IC structures are illustrated in FIGS. 1-2 as being planar rectangles or formed of rectangular solids, this is simply for ease of illustration, and embodiments of various ones of these elements may be curved, rounded, or otherwise irregularly shaped as dictated by, and sometimes inevitable due to, the manufacturing processes used to fabricate semiconductor device assemblies. For example, while FIGS. 1-2 may illustrate various elements, e.g., the S/D regions 116, the S/D electrodes 126, the field plate structures 104/204, etc., as having perfectly straight sidewall profiles, i.e., profiles where the sidewalls extend perpendicularly to the support structure 108, these idealistic profiles may not always be achievable in real-world manufacturing processes. Namely, while designed to have straight sidewall profiles, real-world openings which may be formed as a part of fabricating various elements of the IC structures shown in FIGS. 1-2 may end up having either so-called "re-entrant" profiles, where the width at the top of the opening is smaller than the width at the bottom of the opening, or "non-re-entrant" profile, where the width at the top of the opening is larger than the width at the bottom of the opening. Oftentimes, as a result of a real-world opening not having perfectly straight sidewalls, imperfections may form within the materials filling the opening. For example, typical for re-entrant profiles, a void may be formed in the center of the opening, where the growth of a given material filling the opening pinches off at the top of the opening. Therefore, present descriptions of various embodiments of integrating backside field plate structures with transistors are equally applicable to embodiments where various elements of such integrated structures look different from those shown in the figures due to manufacturing processes used to form them.

Inspection of layout and mask data and reverse engineering of parts of a device to reconstruct the circuit using e.g., optical microscopy, TEM, or SEM, and/or inspection of a cross-section of a device to detect the shape and the location of various device elements described herein using e.g., Physical Failure Analysis (PFA) would allow determination of the integration of backside field plate structures with transistors as described herein.

Manufacturing IC Structures Having Transistors with Backside Field Plate Structures The IC structures implementing one or more transistors with backside field plate structures as described herein may be manufactured using any suitable techniques. FIG. 3 illustrates one example of such a method. However, other examples of manufacturing any of the IC structures described herein, as well as larger devices and assemblies that include such structures (e.g., as shown in FIGS. 6-9) are also within the scope of the present disclosure.

FIG. 3 is a flow diagram of an example method 300 of manufacturing an IC structure that includes a transistor, e.g., a III-N transistor, with a backside field plate structure, in accordance with various embodiments of the present disclosure.

Although the operations of the method 300 are illustrated once each and in a particular order, the operations may be performed in any suitable order and repeated as desired. For example, one or more operations may be performed in parallel to manufacture, substantially simultaneously, multiple III-N transistors with backside field plate structures as described herein. In another example, the operations may be performed in a different order to reflect the structure of a particular device assembly in which one or more transistors with backside field plate structures as described herein will be included.

In addition, the example manufacturing method 300 may include other operations not specifically shown in FIG. 3, such as various cleaning or planarization operations as known in the art. For example, in some embodiments, the support structure 108, as well as layers of various other materials subsequently deposited thereon, may be cleaned prior to, after, or during any of the processes of the method 300 described herein, e.g., to remove oxides, surface-bound organic and metallic contaminants, as well as subsurface contamination. In some embodiments, cleaning may be carried out using e.g., a chemical solutions (such as peroxide), and/or with ultraviolet (UV) radiation combined with ozone, and/or oxidizing the surface (e.g., using thermal oxidation) then removing the oxide (e.g., using hydrofluoric acid (HF)). In another example, the structures/assemblies described herein may be planarized prior to, after, or during any of the processes of the method 300 described herein, e.g., to remove overburden or excess materials. In some embodiments, planarization may be carried out using either wet or dry planarization processes, e.g., planarization be a chemical mechanical planarization (CMP), which may be understood as a process that utilizes a polishing surface, an abrasive and a slurry to remove the overburden and planarize the surface.

Various operations of the method 300 may be illustrated with reference to the example embodiments shown in FIGS. 4A-4C, illustrating fabrication of an IC structure as shown in FIG. 1, but the method 300 may be used to manufacture any suitable IC structures having one or more transistors with backside field plate structures according to any other embodiments of the present disclosure. FIGS. 4A-4C illustrate cross-sectional side views similar to the views shown in FIGS. 1-2, in various example stages in the manufacture of an IC structure using the method of FIG. 3 in accordance with some embodiments of the present disclosure.

The method 300 may begin with providing a channel stack over a support structure (process 302 shown in FIG. 3, a result of which is illustrated with an IC structure 402 shown in FIG. 4A). The IC structure 402 illustrates that the support structure provided in 302 may be the support structure 108 as described above. The IC structure 402 further illustrates that the channel stack provided over the support structure in 302 may include the III-N semiconductor material 112 deposited over the support structure 302, and the polarization material 114 deposited over the III-N semiconductor material 112.

In some embodiments, the process 302 may include epitaxially growing various transistor films, e.g., for forming the III-N material 112 and the polarization material 114. In this context, "epitaxial growth" refers to the deposition of crystalline overlayers in the form of the desired materials. The epitaxial growth of various layers of the process 302 may be carried out using any known gaseous or liquid precursors for forming the desired material layers.

In some embodiments, the process 302 may include patterning to shape the channel stack in the desired geometry, e.g., as an island, so that the channel stack is surrounded by an insulator, e.g. the insulator 110. Any suitable deposition techniques may be used to deposit the insulator 110, such as, but not limited to, spin-coating, dip-coating, atomic layer deposition (ALD), physical vapor deposition (PVD) (e.g., evaporative deposition, magnetron sputtering, or e-beam deposition), or chemical vapor deposition (CVD). Examples patterning techniques which may be used in the process 302 may include, but are not limited to, photolithographic or electron-beam (e-beam) patterning, possibly in conjunction with a suitable etching technique, e.g., a dry etch, such as RF reactive ion etch (RIE) or inductively coupled plasma (ICP) RIE. In various embodiments, any of the etches performed in the process 302 may include an anisotropic etch, using etchants in a form of e.g., chemically active ionized gas (i.e., plasma) using e.g., bromine (Br) and chloride (CI) based chemistries. In some embodiments, during any of the etches of the process 302, the IC structure may be heated to elevated temperatures, e.g., to temperatures between about room temperature and 200 degrees Celsius, including all values and ranges therein, to promote that byproducts of the etch are made sufficiently volatile to be removed from the surface.

The method 300 may then proceed with forming a transistor based on the channel stack provided in 302 (process 304 shown in FIG. 3, a result of which is illustrated with an IC structure 404 shown in FIG. 4B). The IC structure 404 illustrates that the process 304 may include forming the S/D regions 116, performing a recess in the polarization material 114 and forming the gate stack 128 therein, forming contacts to various transistor terminals, etc., to achieve the desired geometry for the transistor. Any of the suitable deposition and patterning techniques used to manufacture transistors may be used in the process 304.

The method 300 may also include providing a backside field plate structure (process 306 shown in FIG. 3, an example result of which is illustrated with an IC structure 406 shown in FIG. 4C). The IC structure 406 illustrates that the process 306 may include forming the field plate structure 204, as described above. In some embodiments, the backside field plate 104/204 structure may be formed after at least some other portions of the transistor 102 have been formed (as shown in FIGS. 4A-4C), but, in other embodiments, the order may be different.

In some embodiments, the backside field plate structure may be formed using any known methods for forming TSVs. The differences in distances from the upper portion of the field plate structure to the polarization layer (e.g., as described with reference to FIG. 2), may be achieved by adjusting the etching process accordingly. For example, the deeper selective recess of gate side of the field plate structure, e.g., as shown in FIG. 2, might be achieved by sidewall formation, and then angled deposition of another dielectric, and then anisotropic dry etch, followed by a profile-smoothing wet etch.

Example Structures and Devices with Transistors Integrated with Backside Field Plate Structures IC structures that include one or more transistors with backside field plate structures as disclosed herein may be included in any suitable electronic device. FIGS. 5-9 illustrate various examples of devices and components that may include one or more transistors integrated with backside field plate structures as disclosed herein.

Figures 5A, 5B:
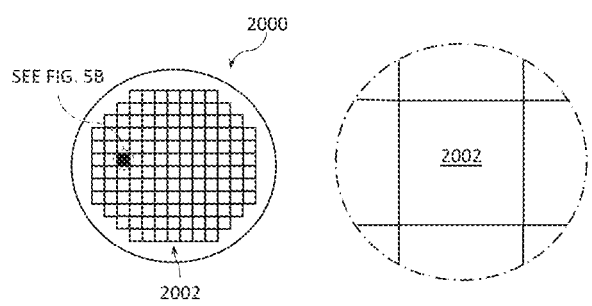
FIGS. 5A-5B are top views of a wafer and dies that include one or more IC structures having one or more transistors with backside field plate structures in accordance with any of the embodiments of the present disclosure.

FIGS. 5A-5B are top views of a wafer 2000 and dies 2002 that may include one or more transistors with backside field plate structures in accordance with any of the embodiments disclosed herein. In some embodiments, the dies 2002 may be included in an IC package, in accordance with any of the embodiments disclosed herein. For example, any of the dies 2002 may serve as any of the dies 2256 in an IC package 2200 shown in FIG. 6. The wafer 2000 may be composed of semiconductor material and may include one or more dies 2002 having IC structures formed on a surface of the wafer 2000. Each of the dies 2002 may be a repeating unit of a semiconductor product that includes any suitable IC (e.g., ICs including one or more transistors with backside field plate structures as described herein). After the fabrication of the semiconductor product is complete (e.g., after manufacture of one or more transistors with backside field plate structures as described herein, e.g., after manufacture of any embodiment of the IC structures 100/200 described herein), the wafer 2000 may undergo a singulation process in which each of the dies 2002 is separated from one another to provide discrete "chips" of the semiconductor product. In particular, devices that include one or more transistors with backside field plate structures as disclosed herein may take the form of the wafer 2000 (e.g., not singulated) or the form of the die 2002 (e.g., singulated). The die 2002 may include one or more transistors (e.g., one or more III-N transistors 102 as described herein) as well as, optionally, supporting circuitry to route electrical signals to the transistors, as well as any other IC components. In some embodiments, the wafer 2000 or the die 2002 may implement an RF FE device, a memory device (e.g., a static random-access memory (SRAM) device), a logic device (e.g., an AND, OR, NAND, or NOR gate), or any other suitable circuit element. Multiple ones of these devices may be combined on a single die 2002.

Figure 6:
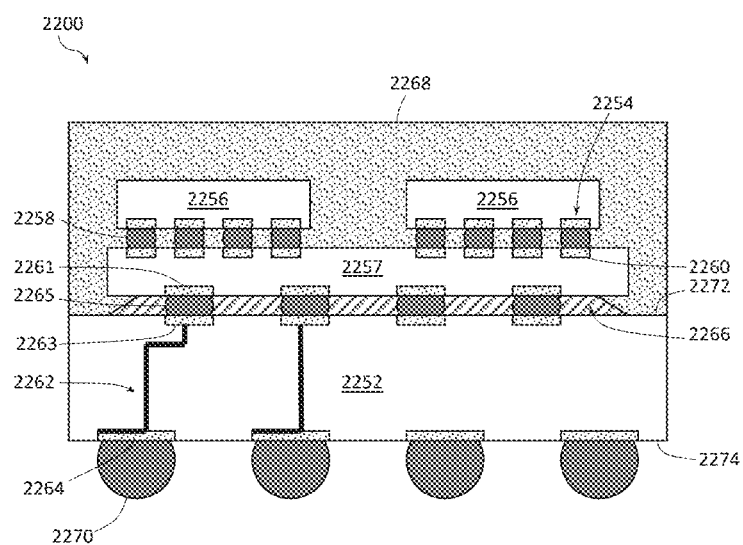
FIG. 6 is a cross-sectional side view of an IC package that may include one or more IC structures having one or more transistors with backside field plate structures in accordance with any of the embodiments of the present disclosure.

FIG. 6 is a side, cross-sectional view of an example IC package 2200 that may include one or more IC structures having one or more transistors integrated with backside field plate structures in accordance with any of the embodiments disclosed herein. In some embodiments, the IC package 2200 may be a system-in-package (SiP).

As shown in FIG. 6, the IC package 2200 may include a package substrate 2252. The package substrate 2252 may be formed of a dielectric material (e.g., a ceramic, a glass, a combination of organic and inorganic materials, a buildup film, an epoxy film having filler particles therein, etc., and may have embedded portions having different materials), and may have conductive pathways extending through the dielectric material between the face 2272 and the face 2274, or between different locations on the face 2272, and/or between different locations on the face 2274.

The package substrate 2252 may include conductive contacts 2263 that are coupled to conductive pathways 2262 through the package substrate 2252, allowing circuitry within the dies 2256 and/or the interposer 2257 to electrically couple to various ones of the conductive contacts 2264 (or to other devices included in the package substrate 2252, not shown).

The IC package 2200 may include an interposer 2257 coupled to the package substrate 2252 via conductive contacts 2261 of the interposer 2257, first-level interconnects 2265, and the conductive contacts 2263 of the package substrate 2252. The first-level interconnects 2265 illustrated in FIG. 6 are solder bumps, but any suitable first-level interconnects 2265 may be used. In some embodiments, no interposer 2257 may be included in the IC package 2200; instead, the dies 2256 may be coupled directly to the conductive contacts 2263 at the face 2272 by first-level interconnects 2265.

The IC package 2200 may include one or more dies 2256 coupled to the interposer 2257 via conductive contacts 2254 of the dies 2256, first-level interconnects 2258, and conductive contacts 2260 of the interposer 2257. The conductive contacts 2260 may be coupled to conductive pathways (not shown) through the interposer 2257, allowing circuitry within the dies 2256 to electrically couple to various ones of the conductive contacts 2261 (or to other devices included in the interposer 2257, not shown). The first-level interconnects 2258 illustrated in FIG. 6 are solder bumps, but any suitable first-level interconnects 2258 may be used. As used herein, a "conductive contact" may refer to a portion of electrically conductive material (e.g., metal) serving as an interface between different components; conductive contacts may be recessed in, flush with, or extending away from a surface of a component, and may take any suitable form (e.g., a conductive pad or socket).

In some embodiments, an underfill material 2266 may be disposed between the package substrate 2252 and the interposer 2257 around the first-level interconnects 2265, and a mold compound 2268 may be disposed around the dies 2256 and the interposer 2257 and in contact with the package substrate 2252. In some embodiments, the underfill material 2266 may be the same as the mold compound 2268. Example materials that may be used for the underfill material 2266 and the mold compound 2268 are epoxy mold materials, as suitable. Second-level interconnects 2270 may be coupled to the conductive contacts 2264. The second-level interconnects 2270 illustrated in FIG. 6 are solder balls (e.g., for a ball grid array arrangement), but any suitable second-level interconnects 22770 may be used (e.g., pins in a pin grid array arrangement or lands in a land grid array arrangement). The second-level interconnects 2270 may be used to couple the IC package 2200 to another component, such as a circuit board (e.g., a motherboard), an interposer, or another IC package, as known in the art and as discussed below with reference to FIG. 7.

The dies 2256 may take the form of any of the embodiments of the die 2002 discussed herein and may include any of the embodiments of an IC structure having one or more transistors with backside field plate structures, e.g., any of the IC structures 100 or 200, described herein. In embodiments in which the IC package 2200 includes multiple dies 2256, the IC package 2200 may be referred to as a multi-chip package (MCP). The dies 2256 may include circuitry to perform any desired functionality. For example, one or more of the dies 2256 may be RF FE dies, including one or more transistors with backside field plate structures in a single die as described herein, one or more of the dies 2256 may be logic dies (e.g., silicon-based dies), one or more of the dies 2256 may be memory dies (e.g., high bandwidth memory), etc. In some embodiments, any of the dies 2256 may include one or more transistors with backside field plate structures, e.g., as discussed above; in some embodiments, at least some of the dies 2256 may not include any transistors with backside field plate structures.

The IC package 2200 illustrated in FIG. 6 may be a flip chip package, although other package architectures may be used. For example, the IC package 2200 may be a ball grid array (BGA) package, such as an embedded wafer-level ball grid array (eWLB) package. In another example, the IC package 2200 may be a wafer-level chip scale package (WLCSP) or a panel fan-out (FO) package. Although two dies 2256 are illustrated in the IC package 2200 of FIG. 6, an IC package 2200 may include any desired number of the dies 2256. An IC package 2200 may include additional passive components, such as surface-mount resistors, capacitors, and inductors disposed on the first face 2272 or the second face 2274 of the package substrate 2252, or on either face of the interposer 2257. More generally, an IC package 2200 may include any other active or passive components known in the art.

Figure 7:
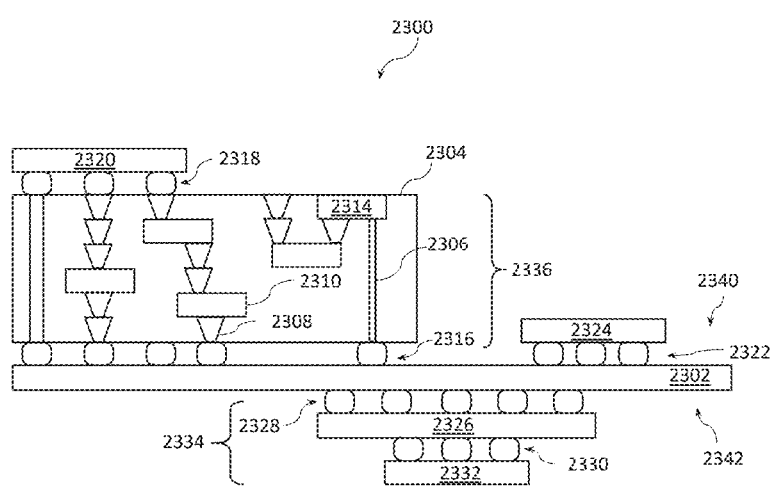
FIG. 7 is a cross-sectional side view of an IC device assembly that may include one or more IC structures having one or more transistors with backside field plate structures in accordance with any of the embodiments of the present disclosure.

FIG. 7 is a cross-sectional side view of an IC device assembly 2300 that may include components having one or more IC structures implementing one or more transistors with backside field plate structures in accordance with any of the embodiments disclosed herein. The IC device assembly 2300 includes a number of components disposed on a circuit board 2302 (which may be, e.g., a motherboard). The IC device assembly 2300 includes components disposed on a first face 2340 of the circuit board 2302 and an opposing second face 2342 of the circuit board 2302; generally, components may be disposed on one or both faces 2340 and 2342. In particular, any suitable ones of the components of the IC device assembly 2300 may include any of the IC structures implementing one or more transistors with backside field plate structures in accordance with any of the embodiments disclosed herein; e.g., any of the IC packages discussed below with reference to the IC device assembly 2300 may take the form of any of the embodiments of the IC package 2200 discussed above with reference to FIG. 6 (e.g., may include one or more transistors with backside field plate structures in/on a die 2256).

In some embodiments, the circuit board 2302 may be a printed circuit board (PCB) including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 2302. In other embodiments, the circuit board 2302 may be a non-PCB substrate.

The IC device assembly 2300 illustrated in FIG. 7 includes a package-on-interposer structure 2336 coupled to the first face 2340 of the circuit board 2302 by coupling components 2316. The coupling components 2316 may electrically and mechanically couple the package-on-interposer structure 2336 to the circuit board 2302, and may include solder balls (e.g., as shown in FIG. 7), male and female portions of a socket, an adhesive, an underfill material, and/or any other suitable electrical and/or mechanical coupling structure.

The package-on-interposer structure 2336 may include an IC package 2320 coupled to an interposer 2304 by coupling components 2318. The coupling components 2318 may take any suitable form for the application, such as the forms discussed above with reference to the coupling components 2316. The IC package 2320 may be or include, for example, a die (the die 2002 of FIG. 5B), an IC device (e.g., the IC structure of FIGS. 1-2), or any other suitable component. In particular, the IC package 2320 may include one or more transistors with backside field plate structures as described herein. Although a single IC package 2320 is shown in FIG. 7, multiple IC packages may be coupled to the interposer 2304; indeed, additional interposers may be coupled to the interposer 2304. The interposer 2304 may provide an intervening substrate used to bridge the circuit board 2302 and the IC package 2320. Generally, the interposer 2304 may spread a connection to a wider pitch or reroute a connection to a different connection. For example, the interposer 2304 may couple the IC package 2320 (e.g., a die) to a BGA of the coupling components 2316 for coupling to the circuit board 2302. In the embodiment illustrated in FIG. 7, the IC package 2320 and the circuit board 2302 are attached to opposing sides of the interposer 2304; in other embodiments, the IC package 2320 and the circuit board 2302 may be attached to a same side of the interposer 2304. In some embodiments, three or more components may be interconnected by way of the interposer 2304.

The interposer 2304 may be formed of an epoxy resin, a fiberglass-reinforced epoxy resin, a ceramic material, or a polymer material such as polyimide. In some implementations, the interposer 2304 may be formed of alternate rigid or flexible materials that may include the same materials described above for use in a semiconductor substrate, such as silicon, germanium, and other group III-V and group IV materials. The interposer 2304 may include metal interconnects 2308 and vias 2310, including but not limited to TSVs 2306. The interposer 2304 may further include embedded devices 2314, including both passive and active devices. Such devices may include, but are not limited to, capacitors, decoupling capacitors, resistors, inductors, fuses, diodes, transformers, sensors, electrostatic discharge (ESD) protection devices, and memory devices. More complex devices such as further RF devices, power amplifiers, power management devices, antennas, arrays, sensors, and microelectromechanical systems (MEMS) devices may also be formed on the interposer 2304. In some embodiments, the IC structures implementing one or more transistors with backside field plate structures as described herein may also be implemented in/on the interposer 2304. The package-on-interposer structure 2336 may take the form of any of the package-on-interposer structures known in the art.

The IC device assembly 2300 may include an IC package 2324 coupled to the first face 2340 of the circuit board 2302 by coupling components 2322. The coupling components 2322 may take the form of any of the embodiments discussed above with reference to the coupling components 2316, and the IC package 2324 may take the form of any of the embodiments discussed above with reference to the IC package 2320.

The IC device assembly 2300 illustrated in FIG. 7 includes a package-on-package structure 2334 coupled to the second face 2342 of the circuit board 2302 by coupling components 2328. The package-on-package structure 2334 may include an IC package 2326 and an IC package 2332 coupled together by coupling components 2330 such that the IC package 2326 is disposed between the circuit board 2302 and the IC package 2332. The coupling components 2328 and 2330 may take the form of any of the embodiments of the coupling components 2316 discussed above, and the IC packages 2326 and 2332 may take the form of any of the embodiments of the IC package 2320 discussed above. The package-on-package structure 2334 may be configured in accordance with any of the package-on-package structures known in the art.

Figure 8:
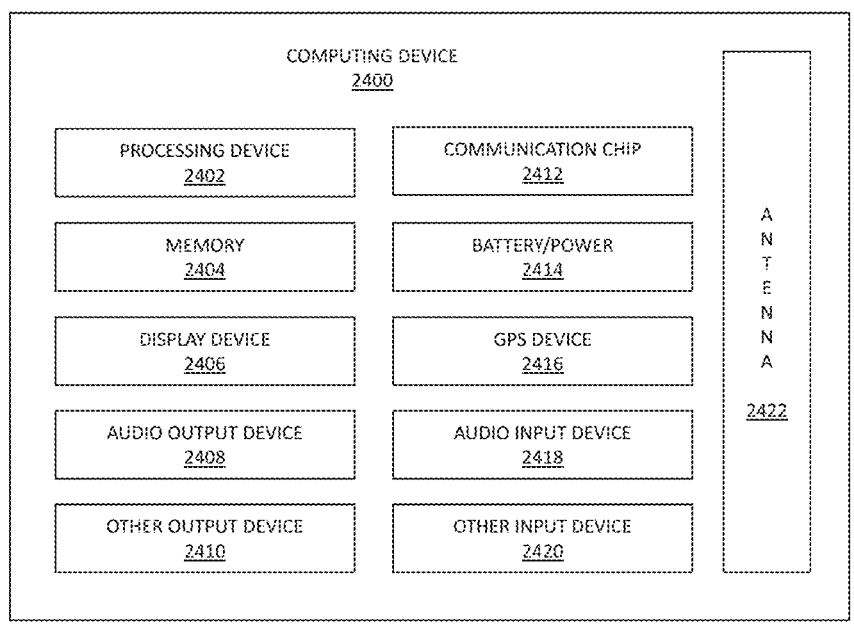
FIG. 8 is a block diagram of an example computing device that may include one or more IC structures having one or more transistors with backside field plate structures in accordance with any of the embodiments of the present disclosure.

FIG. 8 is a block diagram of an example computing device 2400 that may include one or more components with one or more IC structures having one or more transistors integrated with backside field plate structures in accordance with any of the embodiments disclosed herein. For example, any suitable ones of the components of the computing device 2400 may include a die (e.g., the die 2002 (FIG. 5B)) including one or more transistors with backside field plate structures in accordance with any of the embodiments disclosed herein. Any of the components of the computing device 2400 may include an IC device (e.g., any embodiment of the IC structure of FIGS. 1-2) and/or an IC package 2200 (FIG. 6). Any of the components of the computing device 2400 may include an IC device assembly 2300 (FIG. 7).

A number of components are illustrated in FIG. 8 as included in the computing device 2400, but any one or more of these components may be omitted or duplicated, as suitable for the application. In some embodiments, some or all of the components included in the computing device 2400 may be attached to one or more motherboards. In some embodiments, some or all of these components are fabricated onto a single SoC die.

Additionally, in various embodiments, the computing device 2400 may not include one or more of the components illustrated in FIG. 8, but the computing device 2400 may include interface circuitry for coupling to the one or more components. For example, the computing device 2400 may not include a display device 2406, but may include display device interface circuitry (e.g., a connector and driver circuitry) to which a display device 2406 may be coupled. In another set of examples, the computing device 2400 may not include an audio input device 2418 or an audio output device 2408, but may include audio input or output device interface circuitry (e.g., connectors and supporting circuitry) to which an audio input device 2418 or audio output device 2408 may be coupled.

The computing device 2400 may include a processing device 2402 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 2402 may include one or more digital signal processors (DSPs), application-specific ICs (ASICs), central processing units (CPUs), graphics processing units (GPUs), cryptoprocessors (specialized processors that execute cryptographic algorithms within hardware), server processors, or any other suitable processing devices. The computing device 2400 may include a memory 2404, which may itself include one or more memory devices such as volatile memory (e.g., DRAM), nonvolatile memory (e.g., read-only memory (ROM)), flash memory, solid-state memory, and/or a hard drive. In some embodiments, the memory 2404 may include memory that shares a die with the processing device 2402. This memory may be used as cache memory and may include, e.g., eDRAM, and/or spin transfer torque magnetic random-access memory (STT-MRAM).

In some embodiments, the computing device 2400 may include a communication chip 2412 (e.g., one or more communication chips). For example, the communication chip 2412 may be configured for managing wireless communications for the transfer of data to and from the computing device 2400. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 2412 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultramobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 2412 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 2412 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 2412 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 2412 may operate in accordance with other wireless protocols in other embodiments. The computing device 2400 may include an antenna 2422 to facilitate wireless communications and/or to receive other wireless communications (such as AM or FM radio transmissions).

In some embodiments, the communication chip 2412 may manage wired communications, such as electrical, optical, or any other suitable communication protocols (e.g., the Ethernet). As noted above, the communication chip 2412 may include multiple communication chips. For instance, a first communication chip 2412 may be dedicated to shorter-range wireless communications such as Wi-Fi or Bluetooth, and a second communication chip 2412 may be dedicated to longer-range wireless communications such as global positioning system (GPS), EDGE, GPRS, CDMA, WiMAX, LTE, EV-DO, or others. In some embodiments, a first communication chip 2412 may be dedicated to wireless communications, and a second communication chip 2412 may be dedicated to wired communications.

In various embodiments, IC structures as described herein may be particularly advantageous for use within the one or more communication chips 2412, described above. For example, such IC structures may be used to implement one or more of power amplifiers, low-noise amplifiers, filters (including arrays of filters and filter banks), switches, upconverters, downconverters, and duplexers, e.g., as a part of implementing an RF transmitter, an RF receiver, or an RF transceiver.

The computing device 2400 may include battery/power circuitry 2414. The battery/power circuitry 2414 may include one or more energy storage devices (e.g., batteries or capacitors) and/or circuitry for coupling components of the computing device 2400 to an energy source separate from the computing device 2400 (e.g., AC line power).

The computing device 2400 may include a display device 2406 (or corresponding interface circuitry, as discussed above). The display device 2406 may include any visual indicators, such as a heads-up display, a computer monitor, a projector, a touchscreen display, a liquid crystal display (LCD), a light-emitting diode display, or a flat panel display, for example.

The computing device 2400 may include an audio output device 2408 (or corresponding interface circuitry, as discussed above). The audio output device 2408 may include any device that generates an audible indicator, such as speakers, headsets, or earbuds, for example.

The computing device 2400 may include an audio input device 2418 (or corresponding interface circuitry, as discussed above). The audio input device 2418 may include any device that generates a signal representative of a sound, such as microphones, microphone arrays, or digital instruments (e.g., instruments having a musical instrument digital interface (MIDI) output).

The computing device 2400 may include a GPS device 2416 (or corresponding interface circuitry, as discussed above). The GPS device 2416 may be in communication with a satellite-based system and may receive a location of the computing device 2400, as known in the art.

The computing device 2400 may include an other output device 2410 (or corresponding interface circuitry, as discussed above). Examples of the other output device 2410 may include an audio codec, a video codec, a printer, a wired or wireless transmitter for providing information to other devices, or an additional storage device.

The computing device 2400 may include an other input device 2420 (or corresponding interface circuitry, as discussed above). Examples of the other input device 2420 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The computing device 2400 may have any desired form factor, such as a handheld or mobile computing device (e.g., a cell phone, a smart phone, a mobile internet device, a music player, a tablet computer, a laptop computer, a netbook computer, an ultrabook computer, a personal digital assistant (PDA), an ultramobile personal computer, etc.), a desktop computing device, a server or other networked computing component, a printer, a scanner, a monitor, a set-top box, an entertainment control unit, a vehicle control unit, a digital camera, a digital video recorder, or a wearable computing device. In some embodiments, the computing device 2400 may be any other electronic device that processes data.

Figure 9:
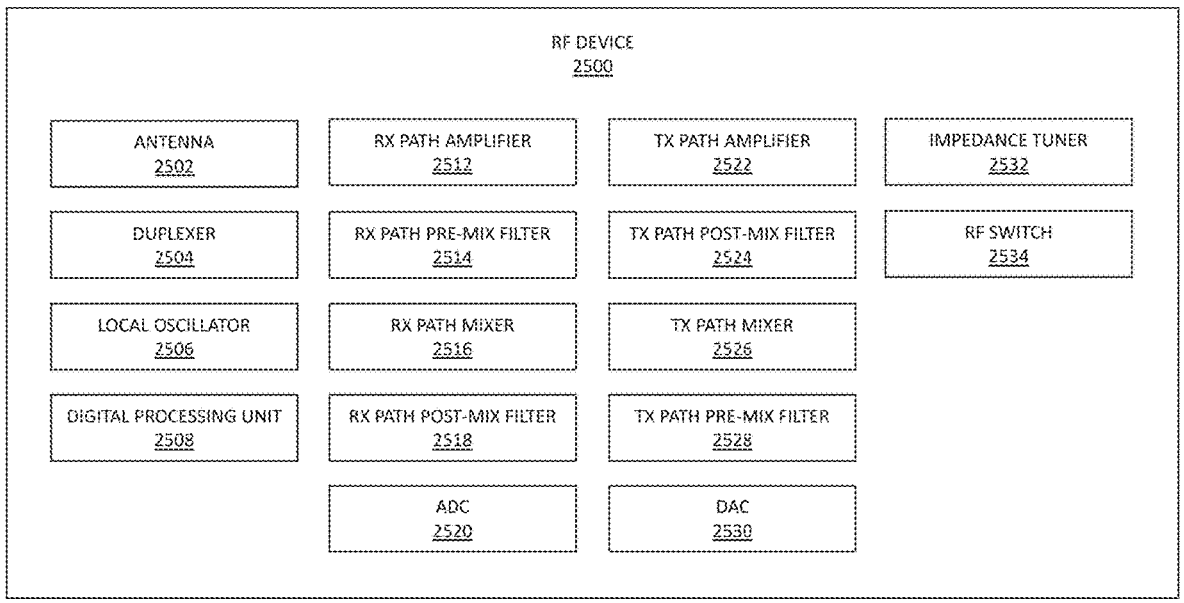
FIG. 9 is a block diagram of an example radio frequency (RF) device that may include one or more IC structures having one or more transistors with backside field plate structures in accordance with any of the embodiments of the present disclosure.

FIG. 9 is a block diagram of an example RF device 2500 that may include one or more components with one or more IC structures having one or more transistors with backside field plate structures in accordance with any of the embodiments disclosed herein. For example, any suitable ones of the components of the RF device 2500 may include a die (e.g., the die 2002 as described with reference to FIG. 5 or a die implementing the IC structure as described with reference to FIG. 1 or 2) including one or more transistors with backside field plate structures in accordance with any of the embodiments disclosed herein. Any of the components of the RF device 2500 may include an IC device (e.g., the IC structure of FIGS. 1-2) and/or an IC package 2200 as described with reference to FIG. 6. Any of the components of the RF device 2500 may include an IC device assembly 2300 as described with reference to FIG. 7. In some embodiments, the RF device 2500 may be included within any components of the computing device 2400 as described with reference to FIG. 8, or may be coupled to any of the components of the computing device 2400, e.g., be coupled to the memory 2404 and/or to the processing device 2402 of the computing device 2400. In still other embodiments, the RF device 2500 may further include any of the components described with reference to FIG. 8, such as, but not limited to, the battery/power circuit 2414, the memory 2404, and various input and output devices as shown in FIG. 8.

In general, the RF device 2500 may be any device or system that may support wireless transmission and/or reception of signals in the form of electromagnetic waves in the RF range of approximately 3 kiloHertz (kHz) to 300 gigaHertz (GHz). In some embodiments, the RF device 2500 may be used for wireless communications, e.g., in a BS or a UE device of any suitable cellular wireless communications technology, such as GSM, WCDMA, or LTE. In a further example, the RF device 2500 may be used as, or in, e.g., a BS or a UE device of a mm-wave wireless technology such as fifth generation (5G) wireless (i.e., high frequency/short wavelength spectrum, e.g., with frequencies in the range between about 20 and 60 GHz, corresponding to wavelengths in the range between about 5 and 15 millimeters). In yet another example, the RF device 2500 may be used for wireless communications using Wi-Fi technology (e.g., a frequency band of 2.4 GHz, corresponding to a wavelength of about 12 cm, or a frequency band of 5.8 GHz, spectrum, corresponding to a wavelength of about 5 cm), e.g., in a Wi-Fi-enabled device such as a desktop, a laptop, a video game console, a smart phone, a tablet, a smart TV, a digital audio player, a car, a printer, etc. In some implementations, a Wi-Fi-enabled device may, e.g., be a node in a smart system configured to communicate data with other nodes, e.g., a smart sensor. Still in another example, the RF device 2500 may be used for wireless communications using Bluetooth technology (e.g., a frequency band from about 2.4 to about 2.485 GHz, corresponding to a wavelength of about 12 cm). In other embodiments, the RF device 2500 may be used for transmitting and/or receiving RF signals for purposes other than communication, e.g., in an automotive radar system, or in medical applications such as magneto-resonance imaging (MRI).

In various embodiments, the RF device 2500 may be included in frequency-domain duplex (FDD) or time-domain duplex (TDD) variants of frequency allocations that may be used in a cellular network. In an FDD system, the uplink (i.e., RF signals transmitted from the UE devices to a BS) and the downlink (i.e., RF signals transmitted from the BS to the US devices) may use separate frequency bands at the same time. In a TDD system, the uplink and the downlink may use the same frequencies but at different times.

A number of components are illustrated in FIG. 9 as included in the RF device 2500, but any one or more of these components may be omitted or duplicated, as suitable for the application. For example, in some embodiments, the RF device 2500 may be an RF device supporting both of wireless transmission and reception of RF signals (e.g., an RF transceiver), in which case it may include both the components of what is referred to herein as a transmit (TX) path and the components of what is referred to herein as a receive (RX) path. However, in other embodiments, the RF device 2500 may be an RF device supporting only wireless reception (e.g., an RF receiver), in which case it may include the components of the RX path, but not the components of the TX path; or the RF device 2500 may be an RF device supporting only wireless transmission (e.g., an RF transmitter), in which case it may include the components of the TX path, but not the components of the RX path.

In some embodiments, some or all of the components included in the RF device 2500 may be attached to one or more motherboards. In some embodiments, some or all of these components are fabricated on a single die, e.g., on a single SoC die.

Additionally, in various embodiments, the RF device 2500 may not include one or more of the components illustrated in FIG. 9, but the RF device 2500 may include interface circuitry for coupling to the one or more components. For example, the RF device 2500 may not include an antenna 2502, but may include antenna interface circuitry (e.g., a matching circuitry, a connector and driver circuitry) to which an antenna 2502 may be coupled. In another set of examples, the RF device 2500 may not include a digital processing unit 2508 or a local oscillator 2506, but may include device interface circuitry (e.g., connectors and supporting circuitry) to which a digital processing unit 2508 or a local oscillator 2506 may be coupled.

As shown in FIG. 9, the RF device 2500 may include an antenna 2502, a duplexer 2504, a local oscillator 2506, a digital processing unit 2508. As also shown in FIG. 9, the RF device 2500 may include an RX path which may include an RX path amplifier 2512, an RX path pre-mix filter 2514, a RX path mixer 2516, an RX path post-mix filter 2518, and an analog-to-digital converter (ADC) 2520. As further shown in FIG. 9, the RF device 2500 may include a TX path which may include a TX path amplifier 2522, a TX path post-mix filter 2524, a TX path mixer 2526, a TX path pre-mix filter 2528, and a digital-to-analog converter (DAC) 2530. Still further, the RF device 2500 may further include an impedance tuner 2532 and an RF switch 2534. In various embodiments, the RF device 2500 may include multiple instances of any of the components shown in FIG. 9. In some embodiments, the RX path amplifier 2512, the TX path amplifier 2522, the duplexer 2504, and the RF switch 2534 may be considered to form, or be a part of, an RF FE of the RF device 2500. In some embodiments, the RX path mixer 2516 and the TX path mixer 2526 (possibly with their associated pre-mix and post-mix filters shown in FIG. 9) may be considered to form, or be a part of, an RF transceiver of the RF device 2500 (or of an RF receiver or an RF transmitter if only RX path or TX path components, respectively, are included in the RF device 2500). Although not specifically shown in FIG. 9, the RF device 2500 may further include one or more control logic elements/circuits for an RF device (e.g., in an RF FR control interface), e.g., to enhance control of complex RF system environment, support implementation of envelope tracking techniques, reduce dissipated power, etc. Various IC structures as described herein may be particularly advantageous for realizing at least portions of such control logic elements/circuits.

The antenna 2502 may be configured to wirelessly transmit and/or receive RF signals in accordance with any wireless standards or protocols, e.g., Wi-Fi, LTE, or GSM, as well as any other wireless protocols that are designated as 3G, 4G, 5G, and beyond. If the RF device 2500 is an FDD transceiver, the antenna 2502 may be configured for concurrent reception and transmission of communication signals in separate, i.e., non-overlapping and non-continuous, bands of frequencies, e.g. in bands having a separation of, e.g., 20 MHz from one another. If the RF device 2500 is a TDD transceiver, the antenna 2502 may be configured for sequential reception and transmission of communication signals in bands of frequencies which may be the same, or overlapping for TX and RX paths. In some embodiments, the RF device 2500 may be a multi-band RF device, in which case the antenna 2502 may be configured for concurrent reception of signals having multiple RF components in separate frequency bands and/or configured for concurrent transmission of signals having multiple RF components in separate frequency bands. In such embodiments, the antenna 2502 may be a single wide-band antenna or a plurality of band-specific antennas (i.e., a plurality of antennas each configured to receive and/or transmit signals in a specific band of frequencies). In various embodiments, the antenna 2502 may include a plurality of antenna elements, e.g., a plurality of antenna elements forming a phased antenna array (i.e., a communication system or an array of antennas that may use a plurality of antenna elements and phase shifting to transmit and receive RF signals). Compared to a single-antenna system, a phased antenna array may offer advantages such as increased gain, ability of directional steering, and simultaneous communication. In some embodiments, the RF device 2500 may include more than one antenna 2502 to implement antenna diversity. In some such embodiments, the RF switch 2534 may be deployed to switch between different antennas.

An output of the antenna 2502 may be coupled to the input of the duplexer 2504. The duplexer 2504 may be any suitable component configured for filtering multiple signals to allow for bidirectional communication over a single path between the duplexer 2504 and the antenna 2502. The duplexer 2504 may be configured for providing RX signals to the RX path of the RF device 2500 and for receiving TX signals from the TX path of the RF device 2500.

The RF device 2500 may include one or more local oscillators 2506, configured to provide local oscillator signals which may be used for downconversion of the RF signals received by the antenna 2502 and/or upconversion of the signals to be transmitted by the antenna 2502.

The RF device 2500 may include the digital processing unit 2508, which may include one or more processing devices. In some embodiments, the digital processing unit 2508 may be implemented as the processing device 2402 shown in FIG. 8, descriptions of which are provided above (when used as the digital processing unit 2508, the processing device 2402 may, but does not have to, implement any of the IC structures as described herein, e.g., IC structures having one or more transistors with backside field plate structures in accordance with any of the embodiments disclosed herein). The digital processing unit 2508 may be configured to perform various functions related to digital processing of the RX and/or TX signals. Examples of such functions include, but are not limited to, decimation/downsampling, error correction, digital downconversion or upconversion, DC offset cancellation, automatic gain control, etc. Although not shown in FIG. 9, in some embodiments, the RF device 2500 may further include a memory device, e.g., the memory device 2404 as described with reference to FIG. 8, configured to cooperate with the digital processing unit 2508. When used within, or coupled to, the RF device 2500, the memory device 2404 may, but does not have to, implement any of the IC structures as described herein, e.g., IC structures having one or more transistors with backside field plate structures in accordance with any of the embodiments disclosed herein.

Turning to the details of the RX path that may be included in the RF device 2500, the RX path amplifier 2512 may include a low-noise amplifier (LNA). An input of the RX path amplifier 2512 may be coupled to an antenna port (not shown) of the antenna 2502, e.g., via the duplexer 2504. The RX path amplifier 2512 may amplify the RF signals received by the antenna 2502.

An output of the RX path amplifier 2512 may be coupled to an input of the RX path pre-mix filter 2514, which may be a harmonic or band-pass (e.g., low-pass) filter, configured to filter received RF signals that have been amplified by the RX path amplifier 2512.

An output of the RX path pre-mix filter 2514 may be coupled to an input of the RX path mixer 2516, also referred to as a downconverter. The RX path mixer 2516 may include two inputs and one output. A first input may be configured to receive the RX signals, which may be current signals, indicative of the signals received by the antenna 2502 (e.g., the first input may receive the output of the RX path pre-mix filter 2514). A second input may be configured to receive local oscillator signals from one of the local oscillators 2506. The RX path mixer 2516 may then mix the signals received at its two inputs to generate a downconverted RX signal, provided at an output of the RX path mixer 2516. As used herein, downconversion refers to a process of mixing a received RF signal with a local oscillator signal to generate a signal of a lower frequency. In particular, the downconverter 2516 may be configured to generate the sum and/or the difference frequency at the output port when two input frequencies are provided at the two input ports. In some embodiments, the RF device 2500 may implement a direct-conversion receiver (DCR), also known as homodyne, synchrodyne, or zero-IF receiver, in which case the RX path mixer 2516 may be configured to demodulate the incoming radio signals using local oscillator signals whose frequency is identical to, or very close to the carrier frequency of the radio signal. In other embodiments, the RF device 2500 may make use of downconversion to an intermediate frequency (IF). IFs may be used in superheterodyne radio receivers, in which a received RF signal is shifted to an IF, before the final detection of the information in the received signal is done. Conversion to an IF may be useful for several reasons. For example, when several stages of filters are used, they can all be set to a fixed frequency, which makes them easier to build and to tune. In some embodiments, the RX path mixer 2516 may include several such stages of IF conversion.

Although a single RX path mixer 2516 is shown in the RX path of FIG. 9, in some embodiments, the RX path mixer 2516 may be implemented as a quadrature downconverter, in which case it would include a first RX path mixer and a second RX path mixer. The first RX path mixer may be configured for performing downconversion to generate an in-phase (I) downconverted RX signal by mixing the RX signal received by the antenna 2502 and an in-phase component of the local oscillator signal provided by the local oscillator 2506. The second RX path mixer may be configured for performing downconversion to generate a quadrature (Q) downconverted RX signal by mixing the RX signal received by the antenna 2502 and a quadrature component of the local oscillator signal provided by the local oscillator 2506 (the quadrature component is a component that is offset in phase from the in-phase component of the local oscillator signal by 90 degrees). The output of the first RX path mixer may be provided to a I-signal path, and the output of the second RX path mixer may be provided to a Q-signal path, which may be substantially 90 degrees out of phase with the I-signal path.

The output of the RX path mixer 2516 may, optionally, be coupled to the RX path post-mix filter 2518, which may be low-pass filters. In case the RX path mixer 2516 is a quadrature mixer that implements the first and second mixers as described above, the in-phase and quadrature components provided at the outputs of the first and second mixers respectively may be coupled to respective individual first and second RX path post-mix filters included in the filter 2518.

The ADC 2520 may be configured to convert the mixed RX signals from the RX path mixer 2516 from analog to digital domain. The ADC 2520 may be a quadrature ADC that, similar to the RX path quadrature mixer 2516, may include two ADCs, configured to digitize the downconverted RX path signals separated in in-phase and quadrature components. The output of the ADC 2520 may be provided to the digital processing unit 2508, configured to perform various functions related to digital processing of the RX signals so that information encoded in the RX signals can be extracted.

Turning to the details of the TX path that may be included in the RF device 2500, the digital signal to later be transmitted (TX signal) by the antenna 2502 may be provided, from the digital processing unit 2508, to the DAC 2530. Similar to the ADC 2520, the DAC 2530 may include two DACs, configured to convert, respectively, digital I- and Q-path TX signal components to analog form.

Optionally, the output of the DAC 2530 may be coupled to the TX path pre-mix filter 2528, which may be a band-pass (e.g., low-pass) filter (or a pair of band-pass, e.g., low-pass, filters, in case of quadrature processing) configured to filter out, from the analog TX signals output by the DAC 2530, the signal components outside of the desired band. The digital TX signals may then be provided to the TX path mixer 2526, which may also be referred to as an upconverter. Similar to the RX path mixer 2516, the TX path mixer 2526 may include a pair of TX path mixers, for in-phase and quadrature component mixing. Similar to the first and second RX path mixers that may be included in the RX path, each of the TX path mixers of the TX path mixer 2526 may include two inputs and one output. A first input may receive the TX signal components, converted to the analog form by the respective DAC 2530, which are to be upconverted to generate RF signals to be transmitted. The first TX path mixer may generate an in-phase (I) upconverted signal by mixing the TX signal component converted to analog form by the DAC 2530 with the in-phase component of the TX path local oscillator signal provided from the local oscillator 2506 (in various embodiments, the local oscillator 2506 may include a plurality of different local oscillators, or be configured to provide different local oscillator frequencies for the mixer 2516 in the RX path and the mixer 2526 in the TX path). The second TX path mixer may generate a quadrature phase (Q) upconverted signal by mixing the TX signal component converted to analog form by the DAC 2530 with the quadrature component of the TX path local oscillator signal. The output of the second TX path mixer may be added to the output of the first TX path mixer to create a real RF signal. A second input of each of the TX path mixers may be coupled the local oscillator 2506.

Optionally, the RF device 2500 may include the TX path post-mix filter 2524, configured to filter the output of the TX path mixer 2526.

The TX path amplifier 2522 may be a power amplifier (PA), configured to amplify the upconverted RF signal before providing it to the antenna 2502 for transmission.

In various embodiments, any of the RX path pre-mix filter 2514, the RX path post-mix filter 2518, the TX post-mix filter 2524, and the TX pre-mix filter 2528 may be implemented as RF filters. In some embodiments, each of such RF filters may include one or more, typically a plurality of, resonators (e.g., film bulk acoustic resonators (FBARs), Lamb wave resonators, and/or contour-wave resonators), arranged, e.g., in a ladder configuration. An individual resonator of an RF filter may include a layer of a piezoelectric material such as aluminum nitride (AlN), enclosed between a bottom electrode and a top electrode, with a cavity provided around a portion of each electrode in order to allow a portion of the piezoelectric material to vibrate during operation of the filter. In some embodiments, an RF filter may be implemented as a plurality of RF filters, or a filter bank. A filter bank may include a plurality of RF resonators which may be coupled to a switch, e. g., the RF switch 2534, configured to selectively switch any one of the plurality of RF resonators on and off (i.e., activate any one of the plurality of RF resonators), in order to achieve desired filtering characteristics of the filter bank (i.e., in order to program the filter bank). For example, such a filter bank may be used to switch between different RF frequency ranges when the RF device 2500 is, or is included in, a BS or in a UE device. In another example, such a filter bank may be programmable to suppress TX leakage on the different duplex distances.

The impedance tuner 2532 may include any suitable circuitry, configured to match the input and output impedances of the different RF circuitries to minimize signal losses in the RF device 2500. For example, the impedance tuner 2532 may include an antenna impedance tuner. Being able to tune the impedance of the antenna 2502 may be particularly advantageous because antenna's impedance is a function of the environment that the RF device 2500 is in, e.g. antenna's impedance changes depending on, e.g., if the antenna is held in a hand, placed on a car roof, etc.

As described above, the RF switch 2534 may be used to selectively switch between a plurality of instances of any one of the components shown in FIG. 9, in order to achieve desired behavior and characteristics of the RF device 2500. For example, in some embodiments, an RF switch may be used to switch between different antennas 2502. In other embodiments, an RF switch may be used to switch between a plurality of RF resonators (e.g., by selectively switching RF resonators on and off) of any of the filters included in the RF device 2500.

In various embodiments, one or more of the III-N transistors as described herein may be particularly advantageous when used in any of the duplexer 2504, RX path amplifier 2512, RX path pre-mix filter 2514, RX path post-mix filter 2518, TX path amplifier 2522, TX path pre-mix filter 2528, TX path post-mix filter 2524, impedance tuner 2532, and/or RF switch 2534.

The RF device 2500 provides a simplified version and, in further embodiments, other components not specifically shown in FIG. 9 may be included. For example, the RX path of the RF device 2500 may include a current-to-voltage amplifier between the RX path mixer 2516 and the ADC 2520, which may be configured to amplify and convert the downconverted signals to voltage signals. In another example, the RX path of the RF device 2500 may include a balun transformer for generating balanced signals. In yet another example, the RF device 2500 may further include a clock generator, which may, e.g., include a suitable phase-locked loop (PLL), configured to receive a reference clock signal and use it to generate a different clock signal which may then be used for timing the operation of the ADC 2520, the DAC 2530, and/or which may also be used by the local oscillator 2506 to generate the local oscillator signals to be used in the RX path or the TX path.

Select Examples

The following paragraphs provide various examples of the embodiments disclosed herein.

Example 1 provides an IC structure that includes a support structure (e.g., a substrate, a die, or a chip), an III-N transistor provided over the support structure, and a field plate structure. The M-N transistor includes a channel stack provided over the support structure, the channel stack including an III-N semiconductor material provided over the support structure, and a polarization material provided over the III-N semiconductor material, a first and a second S/D regions provided in the channel stack, and a gate stack provided over a portion of the channel stack between the first and the second S/D regions. The field plate structure is configured to be coupled to a bias source, and includes a continuous electrically conductive structure having a first portion in the support structure, and further having a second portion, continuous with the first portion, in a portion of the III-N semiconductor material between the first S/D region and the second S/D region.

Example 2 provides the IC structure according to example 1, where a distance from the second portion of the field plate structure to the polarization material is between about 20 and 200 percent of a thickness of the polarization material, including all values and ranges therein, e.g., between about 30 and 100 percent, or between about 50 and 80 percent.

Example 3 provides the IC structure according to example 1, where a distance from a first part of the upper boundary of the second portion of the field plate structure to the polarization material is different from a distance from a second part of the upper boundary of the second portion of the field plate structure to the polarization material.

Example 4 provides the IC structure according to example 3, where the first S/D region is a source region and the second S/D region is a drain region, the second part of the upper boundary of the second portion of the field plate structure is closer to the drain region than the first part, and the distance from the first part of the upper boundary of the second portion of the field plate structure to the polarization material is smaller than the distance from the second part of the upper boundary of the second portion of the field plate structure to the polarization material.

Example 5 provides the IC structure according to example 4, where the distance from the first part of the upper boundary of the second portion of the field plate structure to the polarization material between about 20 and 200 percent of the distance from the second part of the upper boundary of the second portion of the field plate structure to the polarization material, including all values and ranges therein, e.g., between about 30 and 150 percent, or between about 40 and 60 percent.

Example 6 provides the IC structure according to any one of the preceding examples, where a first side wall of the second portion of the field plate structure is under the gate stack and a second side wall of the second portion of the field plate structure, opposite the first side wall, is in a portion of the III-N semiconductor material between the first side wall and the second S/D region.

Example 7 provides the IC structure according to example 6, where a width of the second portion of the field plate structure is between about 20 and 80 percent of a distance between the gate stack and the second S/D region, including all values and ranges therein, e.g., between about 30 and 70 percent, or between about 40 and 60 percent.

Example 8 provides the IC structure according to examples 6 or 7, where an overlap between the second portion of the field plate structure and the gate stack is between about 20 and 80 percent of a width of the gate stack, including all values and ranges therein, e.g., between about 20 and 30 percent, or between about 30 and 70 percent, or between about 40 and 60 percent.

Example 9 provides the IC structure according to any one of the preceding examples, where a distance between the gate stack and the first S/D region is different from a distance between the gate stack and the second S/D region.

Example 10 provides the IC structure according to any one of the preceding examples, where a thickness of a portion of the polarization material between the gate stack and the III-N semiconductor material is between about 1 and 25 nanometers, including all values and ranges therein, e.g., between about 1 and 15 nanometers, between about 1 and 4 nanometers, between about 2 and 5 nanometers, between about 8 and 12 nanometers, or between about 12 and 13 nanometers.

Example 11 provides the IC structure according to any one of the preceding examples, where, during operation of the III-N transistor, the field plate structure is configured to be biased, by the bias source, at a voltage having an absolute value above zero volts and equal to or below a gate voltage applied the III-N transistor.

Example 12 provides the IC structure according to any one of the preceding examples, where the support structure has a first face and an opposite second face, and the electrically conductive structure of the field plate structure extends between the first face and the second face (e.g., the field plate structure is implemented as a TSV).

Example 13 provides the IC structure according to any one of the preceding examples, where the polarization material includes a material having stronger piezo-polarization behavior/properties than the III-N semiconductor material and configured to induce a tensile stress in the III-N semiconductor material.

Example 14 provides the IC structure according to example 13, where the polarization material includes aluminum, indium, gallium, and nitrogen (e.g., $Al_xIn_yGa_zN$).

Example 15 provides the IC structure according to any one of the preceding examples, where the III-N semiconductor material includes nitrogen and one or more of gallium and aluminum (e.g., GaN, AlN, or AlGaN).

Example 16 provides the IC structure according to any one of the preceding examples, where a thickness of the III-N semiconductor material is between about 5 and 1000 nanometers, e.g., between about 5 and 100 nanometers, or between about 10 and 50 nanometers.

Example 17 provides the IC structure according to any one of the preceding examples, further including a buffer material between the III-N semiconductor material and the support structure, where a band gap of the buffer material is greater than a band gap of the III-N semiconductor material.

Example 18 provides the IC structure according to example 17, where the buffer material includes a material including aluminum, gallium, and nitrogen (e.g., AlGaN), or a material including aluminum and nitrogen (e.g., AlN).

Example 19 provides the IC structure according to examples 17 or 18, where a thickness of the buffer material is between about 100 and 5000 nanometers, e.g., between about 250 and 500 nanometers.

Example 20 provides the IC structure according to any one of the preceding examples, where the III-N transistor is a part of an RF circuit, or the III-N transistor is a part of a power circuit.

Example 21 provides an IC package that includes an IC die and a further IC component, coupled to the IC die. The IC die includes an III-N transistor including an III-N semiconductor material provided over the IC die, a polarization material provided over the III-N semiconductor material, and a gate stack provided over a portion of the polarization material, and an electrically conductive structure disposed in the III-N semiconductor material, where at least a portion of the electrically conductive structure is under between about 20 and 80 percent of the width of the gate stack.

Example 22 provides the IC package according to example 21, where a distance from the electrically conductive structure to the polarization material is between about 20 and 200 percent of a thickness of the polarization material, including all values and ranges therein, e.g., between about 30 and 100 percent, or between about 50 and 80 percent.

Example 23 provides the IC package according to examples 21 or 22, where the electrically conductive structure is configured to be coupled to a bias source.

Example 24 provides the IC package according to any one of examples 21-23, where the IC die includes a first face and an opposite second face, the III-N transistor is disposed at the first face of the IC die, and the electrically conductive structure extends between the III-N semiconductor material and the second face of the IC die (e.g., the electrically conductive structure is implemented as a TSV).

Example 25 provides the IC package according to any one of examples 21-24, where the further IC component includes one of a package substrate, an interposer, or a further IC die.

Example 26 provides the IC package according to any one of examples 21-25, where the IC package is included in one of a switch, a power amplifier, a low-noise amplifier, a filter, a filter bank, a duplexer, an upconverter, or a downconverter of an RF communications device, e.g. of an RF transceiver.

Example 27 provides the IC package according to any one of examples 21-26, where the IC package is included in a base station of a wireless communication system.

Example 28 provides the IC package according to any one of examples 21-26, where the IC package is included in a UE device (i.e., a mobile device) of a wireless communication system.

Example 29 provides the IC package according to any one of the preceding examples, where the IC die includes the IC structure according to any one of the preceding examples, e.g., the IC structure according to any one of examples 1-20.

Example 30 provides an electronic device that includes a carrier substrate and an IC die coupled to the carrier substrate, where the IC die includes the transistor arrangement according to any one of examples 1-20, and/or is included in the IC package according to any one of examples 21-29.

Example 31 provides the electronic device according to example 30, where the computing device is a wearable or handheld electronic device.

Example 32 provides the electronic device according to examples 30 or 31, where the electronic device further includes one or more communication chips and an antenna.

Example 33 provides the electronic device according to any one of examples 30-32, where the carrier substrate is a motherboard.

Example 34 provides the electronic device according to any one of examples 30-33, where the electronic device is an RF transceiver.

Example 35 provides the electronic device according to any one of examples 30-34, where the electronic device is one of a switch, a power amplifier, a low-noise amplifier, a filter, a filter bank, a duplexer, an upconverter, or a downconverter of an RF communications device, e.g. of an RF transceiver.

Example 36 provides the electronic device according to any one of examples 30-35, where the electronic device is included in a base station of a wireless communication system.

Example 37 provides the electronic device according to any one of examples 30-35, where the electronic device is included in a UE device (i.e., a mobile device) of a wireless communication system.

Example 38 provides a method of manufacturing an IC structure. The method includes forming a channel stack over a support structure, the channel stack including a III-N semiconductor material and a polarization material over the III-N semiconductor material. The method also includes forming a pair of S/D regions in the channel stack, providing a gate stack over a portion of the channel stack between the pair of S/D regions, and providing an electrically conductive structure in the III-N semiconductor material, where at least a portion of the electrically conductive structure is under between about 20 and 80 percent of the width of the gate stack.

Example 39 provides the method according to example 38, where the support structure has a first face and an opposite second face, the channel stack is formed over the first face of the support structure, and providing the electrically conductive structure includes providing the electrically conductive structure extending from the second face of the support structure to a portion in the III-N semiconductor material that is between about 2 and 100 nanometers from the polarization material, including all values and ranges therein, e.g., between about 5 and 50 nanometers, between about 5 and 30 nanometers, between about 10 and 30 nanometers, or between about 15 and 25 nanometers.

Example 40 provides the method according to example 38 or 39, wherein the IC structure is the IC structure according to any one of examples 1-20 and/or is the IC structure included within the IC package according to any one of examples 21-29 and/or within the electronic device according to any one of examples 30-37, and the method includes corresponding further processes to manufacture any of these IC structures.

The above description of illustrated implementations of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize. These modifications may be made to the disclosure in light of the above detailed description.

The invention claimed is:

1. An integrated circuit (IC) structure, comprising:
   a support structure;
   an III-N transistor, comprising:
      a channel stack over the support structure, the channel stack comprising an III-N semiconductor material, and a polarization material over the III-N semiconductor material, a first region and a second region the channel stack, wherein one of the first region and the second region is a source region and another one is a drain region, and a gate stack over a portion of the channel stack between the first region and the second region; and a structure comprising an electrically conductive material, wherein a first portion of the structure is in the support structure, a second portion of the structure in a portion of the III-N semiconductor material between the first region and the second region, an end of the second portion of the structure is separated from the polarization material by the III-N semiconductor material, and the end of the second portion of the structure is in direct contract with the III-N semiconductor material.

2. The IC structure according to claim 1, wherein a distance from the end of the second portion of the structure to the polarization material is between about 20 and 200 percent of a thickness of the polarization material.

3. The IC structure according to claim 1, wherein a distance from a first part of the end of the second portion of the structure to the polarization material is different from a distance from a second part of the end of the second portion of the structure to the polarization material.

4. The IC structure according to claim 3, wherein:
the first region is the source region and the second region is the drain region,
the second part of the second portion of the structure is closer to the drain region than the first part, and
the distance from the first part of the end of the second portion of the structure to the polarization material is smaller than the distance from the second part of the end of the second portion of the structure to the polarization material.

5. The IC structure according to claim 4, wherein the distance from the first part of the end of the second portion of the structure to the polarization material between 20 and 200 percent of the distance from the second part of the end of the second portion of the structure to the polarization material.

6. The IC structure according to claim 1, wherein a first side wall of the second portion of the structure is under the gate stack and a second side wall of the second portion of the structure, opposite the first side wall, is in a portion of the III-N semiconductor material between the first side wall and the second region.

7. The IC structure according to claim 6, wherein a width of the second portion of the structure is between about 20 and 80 percent of a distance between the gate stack and the second region.

8. The IC structure according to claim 6, wherein an overlap between the second portion of the structure and the gate stack is between about 20 and 80 percent of a width of the gate stack.

9. The IC structure according to claim 1, wherein a thickness of a portion of the polarization material between the gate stack and the III-N semiconductor material is between 1 and 25 nanometers.

10. The IC structure according to claim 1, wherein, during operation of the III-N transistor, the field plate structure is to be biased, by the bias source, at a voltage having an absolute value above zero volts and equal to or below a gate voltage applied the III-N transistor.

11. The IC structure according to claim 1, wherein:
the support structure has a first face and an opposite second face, and
the structure extends between the first face and the second face.

12. The IC structure according to claim 1, wherein the III-N semiconductor material is under a tensile stress.

13. An integrated circuit (IC) package, comprising:
an IC die, comprising:
a transistor comprising an III-N semiconductor material, a polarization material over the III-N semiconductor material, and a gate stack over a portion of the polarization material, and
an electrically conductive structure in the III-N semiconductor material, wherein at least a portion of the electrically conductive structure is under between 20 and 80 percent of the gate stack, a portion of the III-N semiconductor material is between the electrically conductive structure and the gate stack, and a portion of the electrically conductive structure that is closest to the gate stack is in contact with the III-N semiconductor material; and
a further IC component, coupled to the IC die.

14. The IC package according to claim 13, wherein a distance from the electrically conductive structure to the polarization material is between 20 and 200 percent of a thickness of the polarization material.

15. The IC package according to claim 13, wherein:
the IC die includes a first face and an opposite second face,
the transistor is at the first face of the IC die, and
the electrically conductive structure extends between the III-N semiconductor material and the second face of the IC die.

16. The IC package according to claim 13, wherein the IC package is included in one of a switch, a power amplifier, a low-noise amplifier, a filter, a filter bank, a duplexer, an upconverter, or a downconverter of an RF communications device.

17. The IC package according to claim 13, wherein the IC package is included in a base station or in a user equipment device of a wireless communication system.

18. The IC package according to claim 13, wherein the further component is one of a package substrate, a carrier substrate, an interposer, or a further IC die.

19. A method of manufacturing an integrated circuit (IC) structure, the method comprising:
forming a channel stack over a support structure, the channel stack comprising a III-N semiconductor material and a polarization material over the III-N semiconductor material;
forming a first region and a second region in the channel stack, wherein one of the first region and the second region is a source region and another one is a drain region;
providing a gate stack over a portion of the channel stack between the first region and the second region; and
providing an electrically conductive structure in the III-N semiconductor material, wherein at least a portion of the electrically conductive structure is under between 20 and 80 percent of the gate stack, wherein a portion of the III-N semiconductor material is between the electrically conductive structure and the gate stack, and wherein a portion of the electrically conductive structure that is closest to the gate stack is in contact with the III-N semiconductor material.

20. The method according to claim 19, wherein:
the support structure has a first face and an opposite second face, the channel stack is formed over the first face of the support structure, and providing the electrically conductive structure includes providing the electrically conductive structure extending from the second face of the support structure to a portion in the III-N semiconductor material that is between 2 and 100 nanometers from the polarization material.

* * * * *